(12) United States Patent
Fukushima et al.

(10) Patent No.: US 11,839,968 B2
(45) Date of Patent: Dec. 12, 2023

(54) SUBSTRATE TRANSFER DEVICE AND METHOD OF OPERATING THE SAME

(71) Applicant: KAWASAKI JUKOGYO KABUSHIKI KAISHA, Kobe (JP)

(72) Inventors: Takayuki Fukushima, Takarazuka (JP); Shinya Kinoshita, Kobe (JP); Shogo Matsuoka, Kakogawa (JP); Hiroyuki Okada, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 193 days.

(21) Appl. No.: 16/973,686

(22) PCT Filed: Jun. 27, 2019

(86) PCT No.: PCT/JP2019/025667
§ 371 (c)(1),
(2) Date: Dec. 9, 2020

(87) PCT Pub. No.: WO2020/004572
PCT Pub. Date: Jan. 2, 2020

(65) Prior Publication Data
US 2021/0252716 A1    Aug. 19, 2021

(30) Foreign Application Priority Data

Jun. 29, 2018  (JP) .................................. 2018-125253

(51) Int. Cl.
*B25J 11/00*     (2006.01)
*B25J 15/00*     (2006.01)
*B25J 15/08*     (2006.01)

(52) U.S. Cl.
CPC ....... *B25J 11/0095* (2013.01); *B25J 15/0014* (2013.01); *B25J 15/08* (2013.01); *Y10S 414/138* (2013.01)

(58) Field of Classification Search
None
See application file for complete search history.

(56) References Cited

U.S. PATENT DOCUMENTS 5,061,144 A  *  10/1991  Akimoto  ........... H01L 21/68707
414/935
5,955,858 A  *  9/1999  Kroeker  ............ H01L 21/68707
294/94
(Continued)

FOREIGN PATENT DOCUMENTS

CN       107758345 A     3/2018
JP       2003-118834 A   4/2003
(Continued)

*Primary Examiner* — Michael S Lowe
(74) *Attorney, Agent, or Firm* — Oliff PLC

(57) ABSTRACT

A substrate transfer device includes a manipulator, a substrate gripping hand, an actuator configured to rotate the substrate gripping hand about a roll axis, and a controller adapted to operate the manipulator to hold a substrate by a first engaging member and a second engaging member of the substrate gripping hand, then operate the actuator so that a first principal surface of the substrate is located above a base member, and a normal line of the first principal surface is oriented downward from a horizontal plane, and move a movable guiding member toward the tip-end part of the base member so that the second engaging member, a third engaging member, and the movable guiding member grip the substrate.

6 Claims, 17 Drawing Sheets

(56) References Cited

U.S. PATENT DOCUMENTS

| | | | | |
|---|---|---|---|---|
| 6,109,677 | A * | 8/2000 | Anthony | H01L 21/67706 |
| | | | | 414/941 |
| 6,113,165 | A * | 9/2000 | Wen | H01L 21/68707 |
| | | | | 414/941 |
| 6,322,312 | B1 * | 11/2001 | Sundar | B25J 15/0206 |
| | | | | 414/744.5 |
| 6,752,442 | B2 * | 6/2004 | McNurlin | H01L 21/68707 |
| | | | | 294/90 |
| 7,153,088 | B2 * | 12/2006 | Reimer | H01L 21/68707 |
| | | | | 414/217 |
| 2018/0254210 | A1 | 9/2018 | Fukushima et al. | |

FOREIGN PATENT DOCUMENTS

| | | |
|---|---|---|
| JP | 2010-165998 A | 7/2010 |
| JP | 2010-168152 A | 8/2010 |
| KR | 10-2017-0053705 A | 5/2017 |

\* cited by examiner

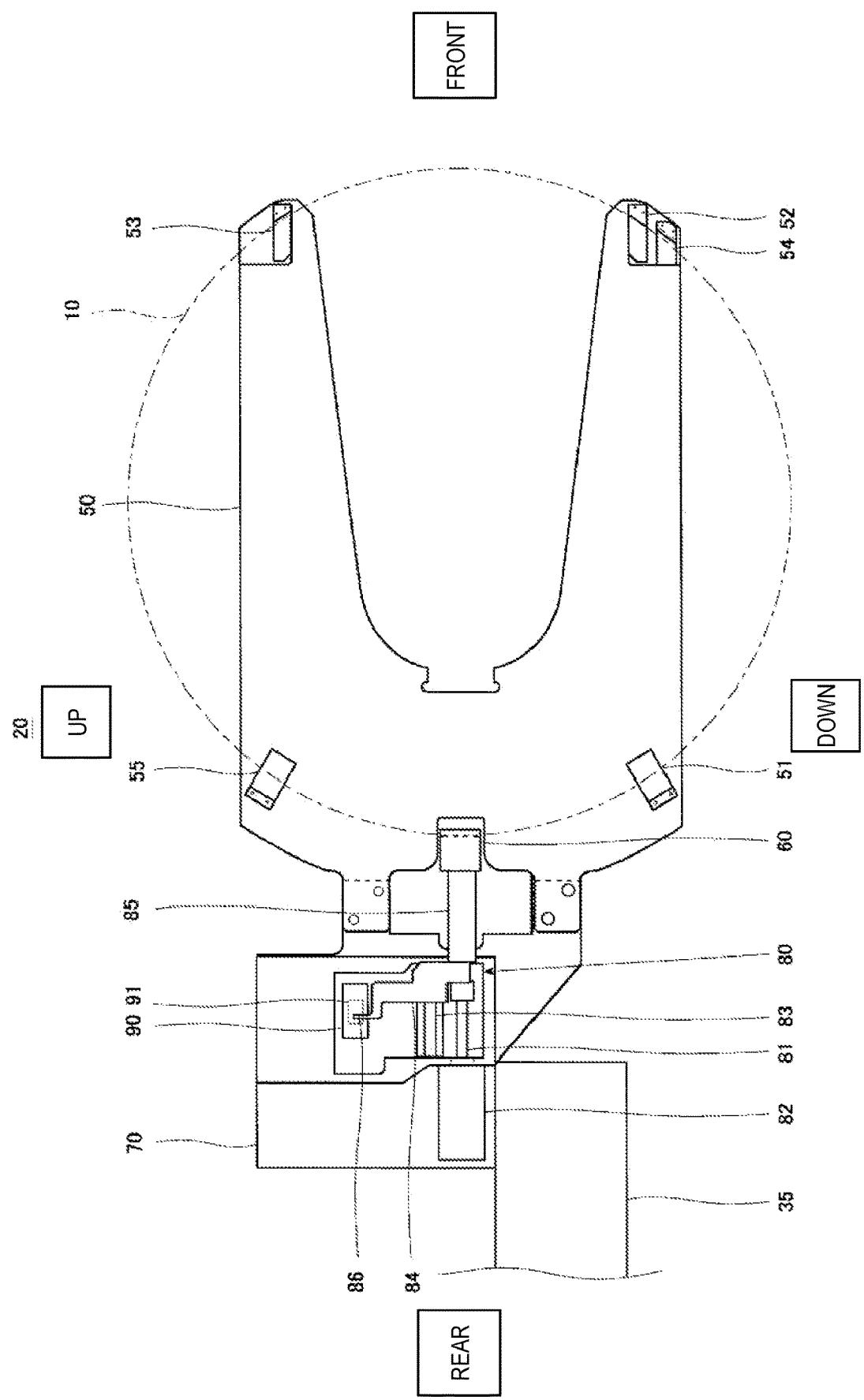

SUBSTRATE TRANSFER DEVICE AND METHOD OF OPERATING THE SAME

TECHNICAL FIELD

The present disclosure relates to a substrate transfer device and a method of operating the substrate transfer device.

BACKGROUND ART

Semiconductor wafers (semiconductor substrates; hereinafter, they may simply be referred to as "wafers" or "substrates") are manufactured through a plurality of processings inside a clean room. The semiconductor wafers are transferred between these processings by a robot disposed inside the clean room.

As one example of such a robot disposed inside the clean room, a robotic transfer device which grips and transfers the semiconductor wafer placed in a vertical posture, is known (e.g., Patent Document 1). A robotic transfer device disclosed in Patent Document 1 includes, in order to load and unload a plurality of large semiconductor wafers in a vertical direction, an end effector with a tip-end part curving in a thickness direction of a wafer and a direction along a periphery of the wafer on a distal side, a distal pad provided to the tip-end part of the end effector, a lower proximal pad provided below a straight line passing thorough the center of the wafer and a position where the distal pad contacts with the periphery of the wafer, and an upper proximal pad provided above the straight line.

In the robotic transfer device disclosed in Patent Document 1, the distal pad contacts with the periphery of the wafer, and then, the lower proximal pad and the upper proximal pad advance and contact with the periphery of the wafer so as to grip the wafer with these pads.

REFERENCE DOCUMENT OF CONVENTIONAL ART

Patent Document

[Patent Document 1] JP2010-165998A

DESCRIPTION OF THE DISCLOSURE

Problem to be Solved by the Disclosure

However, if the pads do not accurately contact with the periphery of the wafer, even the robotic transfer device disclosed in Patent document 1 cannot accurately grip the wafer, and thus, it may drop the wafer.

The present disclosure is made in view of solving the conventional problem described above, and one purpose thereof is to provide a substrate transfer device and a method of operating the substrate transfer device, which can reduce dropping of a substrate compared to the conventional substrate transfer device.

SUMMARY OF THE DISCLOSURE

In order to solve the conventional problem, according to one aspect of the present disclosure, a substrate transfer device for gripping and transferring a substrate maintained in one of a vertical posture and an inclined posture, is provided. The substrate transfer device includes a manipulator, a substrate gripping hand provided to a tip-end part of the manipulator, an actuator configured to rotate the substrate gripping hand about a roll axis, and a controller. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The controller is adapted to (A) operate the manipulator to hold the substrate by the first engaging member and the second engaging member of the substrate gripping hand, (B) then operate the actuator so that a first principal surface of the substrate, that is a principal surface facing to the base member, is located above the base member, and a normal line of the first principal surface is oriented downward from a horizontal plane, and (C) move the movable guiding member toward the tip-end part of the base member to push a circumferential surface of the substrate so that the second engaging member, the third engaging member, and the movable guiding member grip the substrate.

According to this configuration, since a force equivalent to the weight of the substrate acts on the base member, the substrate can be prevented from being dropped even if any one of the second engaging member, the third engaging member, and the movable guiding member does not accurately contact with the substrate.

Moreover, according to one aspect of the present disclosure, a substrate transfer device for gripping and transferring a substrate maintained in one of a vertical posture and an inclined posture, is provided. The substrate transfer device includes a manipulator, a substrate gripping hand provided to a tip-end part of the manipulator, an actuator configured to rotate the substrate gripping hand about a roll axis, a first detector configured to detect whether the substrate is correctly gripped by the substrate gripping hand, and a controller. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The controller is adapted to (D) operate the manipulator to hold the substrate by the first engaging member and the second engaging member of the substrate gripping hand, (E) then move the movable guiding member toward the tip-end part of the base member to push a circumferential surface of the substrate so that the second engaging member, the third engaging member, and the movable guiding member grip the substrate, (F) then move the movable guiding member toward the base-end part of the base member when the first detector detects that the substrate is not correctly gripped by the substrate gripping hand, and operate the actuator so that a first principal surface of the substrate, that is a principal surface facing to the base member, is located above the base member, and a normal line of the first principal surface is oriented downward from a horizontal plane, and then execute (E) again.

According to this configuration, when the substrate cannot be gripped correctly, the movable guiding member is released from the contact with the substrate, and the gripping operation of the substrate (the operation of (E)) is executed again, and therefore, the substrate can be gripped more accurately than the conventional substrate transfer device.

Further, when releasing the movable guiding member from the contact with the substrate, the actuator is operated so that the force equivalent to the weight of the substrate acts on the base member, and thus, the substrate can be prevented from being dropped.

Furthermore, since the force equivalent to the weight of the substrate acts on the base member, the substrate can be held at a certain position by the first engaging member and the second engaging member. Thus, when again executing the gripping operation of the substrate, the second engaging member, the third engaging member, and the movable guiding member can correctly contact with the substrate to grip the substrate correctly.

Moreover, according to one aspect of the present disclosure, a method of operating a substrate transfer device for gripping and transferring a substrate maintained in one of a vertical posture and an inclined posture, is provided. The substrate transfer device includes a manipulator, a substrate gripping hand provided to a tip-end part of the manipulator, and an actuator configured to rotate the substrate gripping hand about a roll axis. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The method includes the steps of (A) operating the manipulator to hold the substrate by the first engaging member and the second engaging member of the substrate gripping hand, (B) then operating the actuator so that a first principal surface of the substrate, that is a principal surface facing to the base member, is located above the base member, and a normal line of the first principal surface is oriented downward from a horizontal plane, and (C) moving the movable guiding member to push a circumferential surface of the substrate so that the second engaging member, the third engaging member, and the movable guiding member grip the substrate.

According to this configuration, since the force equivalent to the weight of the substrate acts on the base member, the substrate can be prevented from being dropped even if any one of the second engaging member, the third engaging member, and the movable guiding member does not accurately contact with the substrate.

Moreover, according to one aspect of the present disclosure, a method of operating a substrate transfer device for gripping and transferring a substrate maintained in one of a vertical posture and an inclined posture, is provided. The substrate transfer device includes a manipulator, a substrate gripping hand provided to a tip-end part of the manipulator, an actuator configured to rotate the substrate gripping hand about a roll axis, and a first detector configured to detect whether the substrate is correctly gripped by the substrate gripping hand. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The method includes the steps of (D) operating the manipulator to hold the substrate by the first engaging member and the second engaging member of the substrate gripping hand, (E) then moving the movable guiding member toward the tip-end part of the base member to push a circumferential surface of the substrate so that the second engaging member, the third engaging member, and the movable guiding member grip the substrate, (F) then moving the movable guiding member toward the base-end part of the base member when the first detector detects that the substrate is not correctly gripped by the substrate gripping hand, and operating the actuator so that a first principal surface of the substrate, that is a principal surface facing to the base member, is located above the base member, and a normal line of the first principal surface is oriented downward from a horizontal plane, and (G) then executing (E) again.

According to this configuration, when the substrate cannot be gripped correctly, the movable guiding member is released from the contact with the substrate, and the gripping operation of the substrate (the operation of (E)) is executed again, and therefore, the substrate can be gripped more accurately than the conventional substrate transfer device.

Further, when releasing the movable guiding member from the contact with the substrate, the actuator is operated so that the force equivalent to the weight of the substrate acts on the base member, and thus, the substrate can be prevented from being dropped.

Furthermore, since the force equivalent to the weight of the substrate acts on the base member, the substrate can be held at a certain position by the first engaging member and the second engaging member. Thus, when again executing the gripping operation of the substrate, the second engaging member, the third engaging member, and the movable guiding member can correctly contact with the substrate to grip the substrate correctly.

The above purpose, other purposes, features, and advantages of the present disclosure will be made clear from the following detailed description of suitable embodiments with reference to the accompanying drawings.

Effect of the Disclosure

According to the substrate transfer device and the method of operating the substrate transfer device of the present disclosure, the dropping of the substrate can be reduced compared to the conventional substrate transfer device.

BRIEF DESCRIPTION OF DRAWINGS

FIG. 12 is a schematic view illustrating an outline configuration of the substrate gripping hand of the substrate transfer device according to Embodiment 3.

MODES FOR CARRYING OUT THE DISCLOSURE

Figure 1:
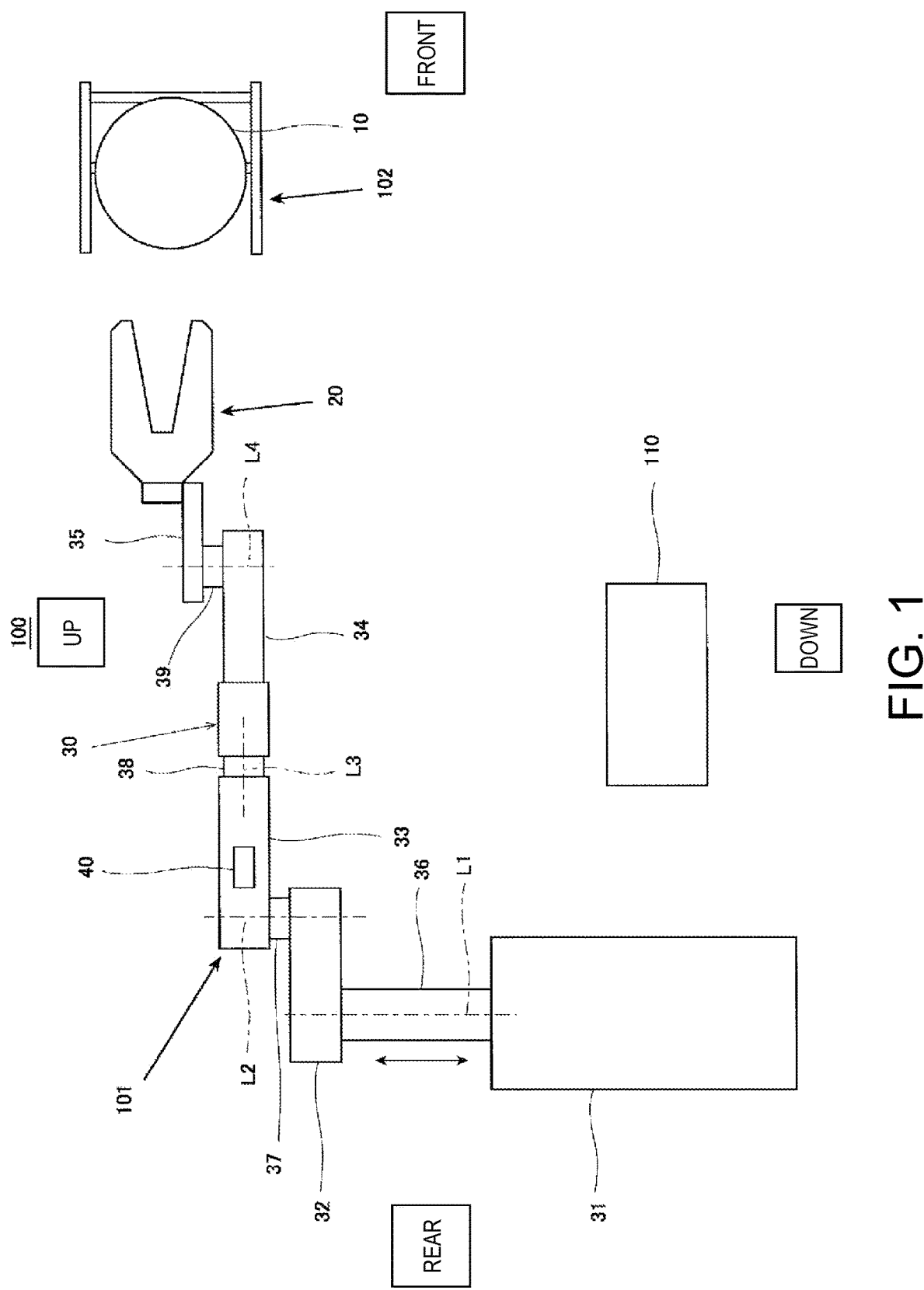
FIG. 1 is a schematic view illustrating an outline configuration of a substrate transfer system including a substrate transfer device according to Embodiment 1.

Hereinafter, embodiments of the present disclosure are described with reference to the drawings. Note that the same reference characters are given to the same or corresponding components throughout the drawings to omit redundant description. Moreover, in all the drawings, components required to describe the present disclosure are extracted and illustrated, and other components may be omitted. The present disclosure is not limited to the embodiments described below.

Embodiment 1

A substrate transfer device according to Embodiment 1 is a substrate transfer device for gripping and transferring a substrate maintained in one of a vertical posture and an inclined posture. The substrate transfer device includes a manipulator, a substrate gripping hand provided to a tip-end part of the manipulator, an actuator configured to rotate the substrate gripping hand about a roll axis, and a controller. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The controller (A) operates the manipulator to hold the substrate by the first engaging member and the second engaging member of the substrate gripping hand. The controller (B) then operates the actuator so that a first principal surface of the substrate, that is a principal surface facing to the base member, is located above the base member, and a normal line of the first principal surface is oriented downward from a horizontal plane, and (C) moves the movable guiding member toward the tip-end part of the base member to push a circumferential surface of the substrate so that the second engaging member, the third engaging member, and the movable guiding member grip the substrate.

Moreover, in the substrate transfer device according to Embodiment 1, the substrate gripping hand may further include a fourth engaging member provided at the lower part of the tip-end part of the base member, below and on the base-end side of the second engaging member. In (C), the controller may cause the third engaging member, the fourth engaging member, and the movable guiding member to grip the substrate.

Moreover, in the substrate transfer device according to Embodiment 1, in (C), the controller may cause the second engaging member, the third engaging member, the fourth engaging member, and the movable guiding member to grip the substrate.

Below, one example of the substrate transfer device according to Embodiment 1 is described with reference to FIGS. 1 to 7.

[Configuration of Substrate Transfer System]

FIG. 1 is a schematic view illustrating an outline configuration of a substrate transfer system including the substrate transfer device according to Embodiment 1. Note that in FIG. 1 a front-and-rear direction and an up-and-down direction of the substrate transfer device are indicated as a "front-and-rear direction" and an "up-and-down direction" of the drawing, respectively.

As illustrated in FIG. 1, a substrate transfer system 100 includes a substrate transfer device 101 according to Embodiment 1 and a container 102. A plurality of disk-shape substrates 10 are parallelly placed in a vertical posture in the container 102. Here, the "vertical posture" is a state in which a principal surface of the substrate 10 is oriented in a vertical direction. Note that the substrate 10 may be placed in the container 102 in an inclined posture (in a state the principal surface inclines). The container 102 is a boat, for example.

The substrate 10 may be a thin circular plate, such as a semiconductor substrate and a glass substrate, which becomes a material for a substrate of a semiconductor device. The semiconductor substrate is, for example, a silicon substrate, sapphire (alumina single crystal) substrate, or another type of substrate. The glass substrate is, for example, a glass substrate for FPD (Flat Panel Display), or a glass substrate for MEMS (Micro Electro Mechanical Systems).

[Configuration of Substrate Transfer Device]

As illustrated in FIG. 1, the substrate transfer device 101 according to Embodiment 1 includes a substrate gripping hand 20, a manipulator 30, and a controller 110, and transfers the substrate 10 while holding it by the substrate gripping hand 20.

Note that the substrate transfer device 101 according to Embodiment 1 may grip the substrate 10 in the vertical or inclined posture, and change the posture of the gripped substrate 10 to a horizontal posture to transfer it. Alternatively, the substrate transfer device 101 may grip the substrate 10 placed in the horizontal posture, and change the posture of the gripped substrate 10 to the vertical or inclined posture to transfer it.

Moreover, although the substrate transfer device 101 according to Embodiment 1 is disposed on a floor surface, it is not limited to this. The substrate transfer device 101 may be hung from a ceiling. Moreover, although the manipulator 30 described below is comprised of a horizontal articulated robot, it is not limited to this. The manipulator 30 may be based on a vertical articulated robot.

The manipulator 30 includes a pedestal 31, a first arm 32, a second arm 33, a third arm 34, a base part 35, a support shaft 36, a first connecting part 37, a second connecting part 38, and a third connecting part 39.

The pedestal 31 is provided with the support shaft 36. The support shaft 36 includes, for example, a ball screw mechanism, a drive motor, a rotary sensor which detects a rotational position of the drive motor, and a current sensor which detects a current for controlling a rotation of the drive motor (none of them are illustrated). The support shaft 36 is configured to vertically expand and contract, and rotate. Note that the drive motor is, for example, a servomotor which is servo controlled by the controller 110. Moreover, the rotary sensor is an encoder, for example.

A base-end part of the first arm 32 is connected to the support shaft 36 so as to be rotatable about a rotation axis L1 passing through an axial center of the support shaft 36. A base-end part of the second arm 33 is connected to a tip-end part of the first arm 32 via the first connecting part 37 so as to be rotatable about a rotation axis L2. Note that the rotation axis L1 and the rotation axis L2 are set so that the axial centers thereof orient in the vertical direction.

The first connecting part 37 includes, for example, a drive motor, a rotary sensor which detects a rotational position of the drive motor, and a current sensor which detects a current for controlling a rotation of the drive motor (none of them are illustrated), and rotates (pivots) the first arm 32. Note that the drive motor may be provided to the support shaft 36. Moreover, the drive motor may be a servomotor which is servo controlled by the controller 110. The rotary sensor is an encoder, for example.

Moreover, a base-end part of the third arm 34 is connected to a tip-end part of the second arm 33 via the second connecting part 38 so as to be rotatable about a rotation axis L3. A base-end part of the base part 35 is connected to a tip-end part of the third arm 34 via the third connecting part 39 so as to be rotatable about a rotation axis L4. Moreover, the substrate gripping hand 20 is connected to a tip-end part of the base part 35. Note that the rotation axis L3 is set so that its axial center orients in the horizontal direction. The rotation axis L4 is set so that its axial center orients in the vertical direction.

The second connecting part 38 includes, for example, a drive motor (actuator) 40, a rotary sensor which detects a rotational position of the drive motor, and a current sensor which detects a current for controlling a rotation of the drive motor (none of them are illustrated). The second connecting part 38 rotates (pivots) the third arm 34 about the rotation axis L3 (a roll axis). Similarly, the third connecting part 39 includes, for example, a drive motor, a rotary sensor which detects a rotational position of the drive motor, and a current sensor which detects a current for controlling a rotation of the drive motor (none of them are illustrated), and rotates (pivots) the base part 35 about the rotation axis L4.

Note that the drive motors may be provided to the second arm 33 or the third arm 34, respectively. Moreover, the drive motors may be servomotors which are servo controlled by the controller 110. Moreover, the rotary sensors are encoders, for example.

The controller 110 includes a processor, such as a microprocessor and a CPU, and a memory, such as a ROM and a RAM (not illustrated). The memory stores information such as a basic program and various fixed data. The processor reads and executes software such as the basic program stored in the memory so as to control various operations of the substrate transfer system 100.

Note that the controller 110 may be comprised of a sole controller 110 which executes a centralized control, or a plurality of controllers 110 which execute a distributed control by cooperating with each other. Moreover, the controller 110 may be comprised of a microcomputer, or may be comprised of an MPU, a PLC (Programmable Logic Controller), a logic circuit, etc.

[Configuration of Substrate Gripping Hand]

Next, a configuration of the substrate gripping hand 20 is described in detail with reference to FIGS. 1 to 3.

Figure 2:
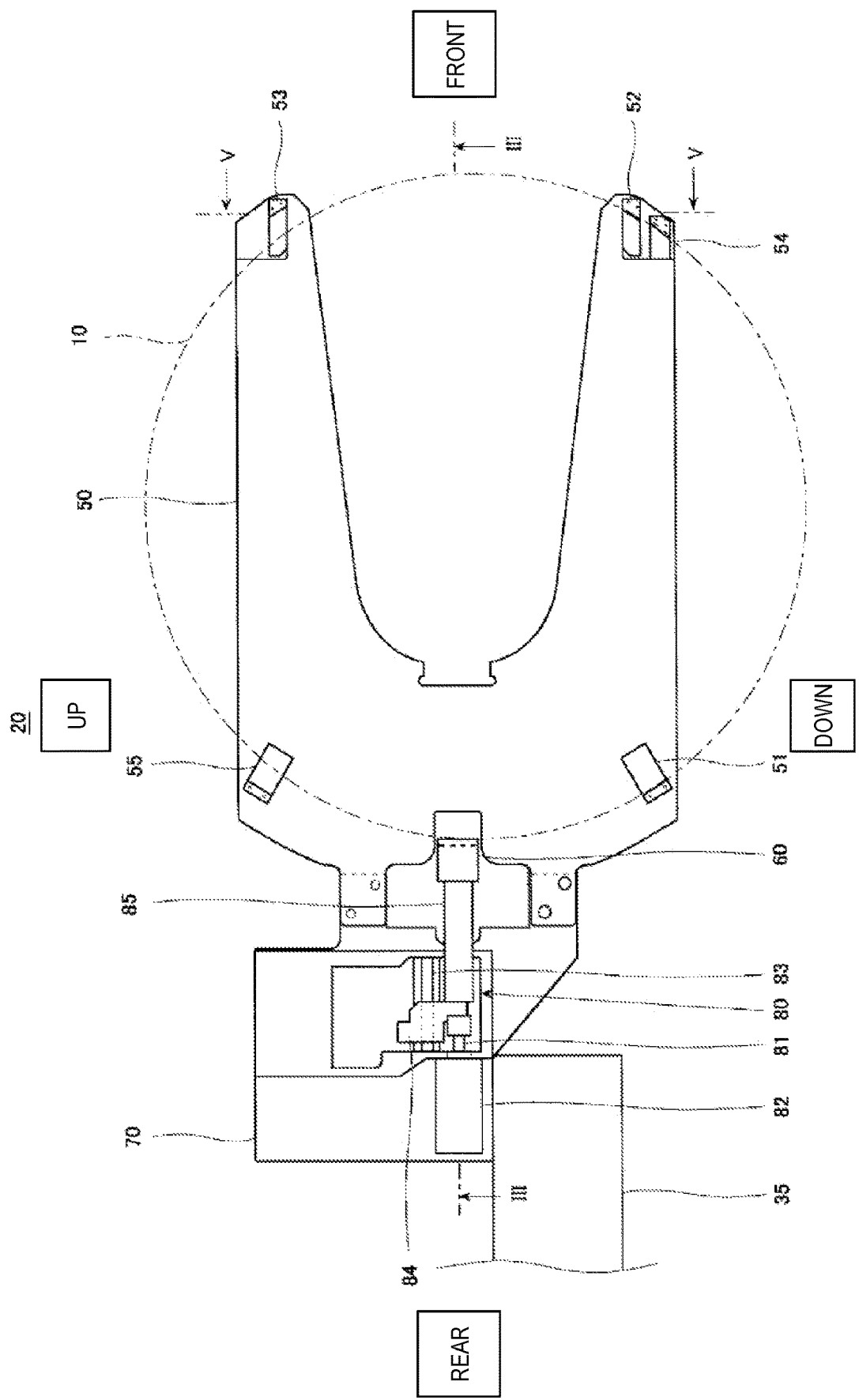
FIG. 2 is a right-side view of a substrate gripping hand of the substrate transfer device illustrated in FIG. 1.

FIG. 2 is a right-side view of the substrate gripping hand of the substrate transfer device illustrated in FIG. 1. FIG. 3 is a cross sectional view taken along a line III-III illustrated in FIG. 2.

Figure 3:
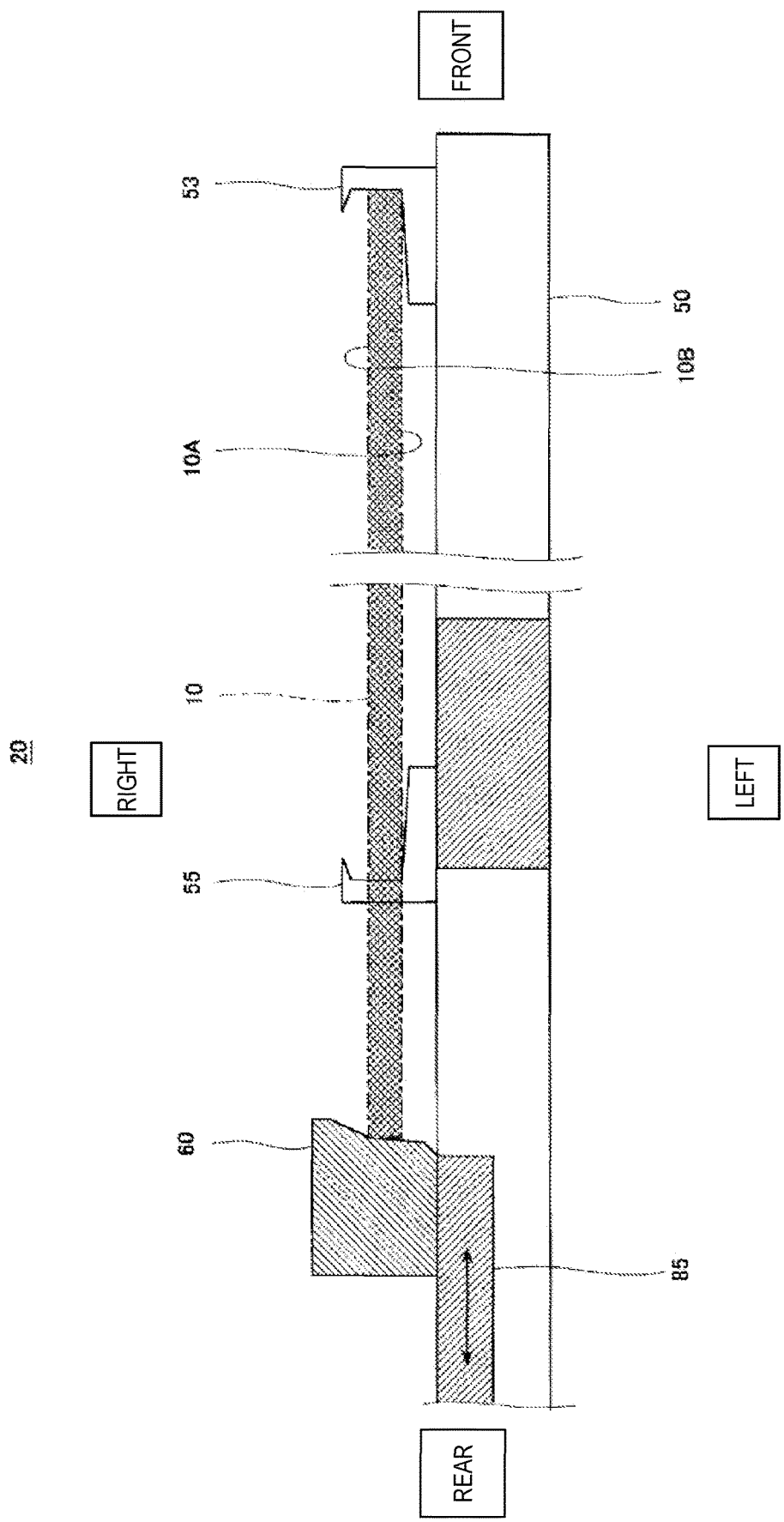
FIG. 3 is a cross sectional view taken along a line III-III illustrated in FIG. 2.

Note that in FIGS. 2 and 3 the substrate is indicated by a dashed line so as to facilitate the understanding of the configuration of the substrate gripping hand. In FIG. 3, illustration of a part of the substrate gripping hand is omitted. In FIG. 2, the front-and-rear direction and the up-and-down direction of the substrate transfer device are indicated as the "front-and-rear direction" and the "up-and-down direction" of the drawing, respectively. Similarly, in FIG. 3, the front-and-rear direction and a left-and-right direction of the substrate transfer device are indicated as the "front-and-rear direction" and a "left-and-right direction" of the drawing, respectively.

As illustrated in FIGS. 2 and 3, the substrate gripping hand 20 includes a base member 50 in a plate shape, a first engaging member 51, a second engaging member 52, a third engaging member 53, a movable guiding member 60, and a connecting member 70. The base member 50 is formed in a substantially U-shape (substantially Y-shape) in a side view, and a base-end part thereof is connected to the base part 35 via the connecting member 70.

The first engaging member 51 is provided at a lower part of the base-end part of the base member 50, and the second engaging member 52 is provided at a lower part of a tip-end part of the base member 50. Moreover, the third engaging member 53 is provided at an upper part of the tip-end part of the base member 50.

The second engaging member 52 contacts (engages) with a periphery part and a circumferential surface of the substrate 10 when it scoops up and holds the substrate 10 in the vertical or inclined posture. The third engaging member 53 contacts (engages) with the periphery part and the circumferential surface of the substrate 10 when the movable guiding member 60 moves so as to contact with the circumferential surface of the substrate 10. Note that the second engaging member 52 may contact (engage) with the periphery part and the circumferential surface of the substrate 10 also when the movable guiding member 60 moves so as to contact with the circumferential surface of the substrate 10.

Note that the base member 50 may be provided with a fourth engaging member 54 below and on the base-end side of the second engaging member 52. The fourth engaging member 54 may contact (engage) with the periphery part and the circumferential surface of the substrate 10 when it scoops up and holds the substrate 10 in the vertical or inclined posture. Moreover, the fourth engaging member 54 may contact (engage) with the periphery part and the circumferential surface of the substrate 10 also when the movable guiding member 60 moves so as to contact with the circumferential surface of the substrate 10.

Moreover, a fifth engaging member 55 may be provided at an upper part of the base-end part of the base member 50. The fifth engaging member 55 may contact (engage) with the periphery part of the substrate 10 when the movable guiding member 60 moves so as to contact with or separate from the circumferential surface of the substrate 10.

As illustrated in FIG. 3, the third engaging member 53 and the fifth engaging member 55 are formed in a substantially hook-shape (substantially J-shape), and contact (engage) with the circumferential surface of the substrate 10 and the periphery part of the principal surface of the substrate 10. Similarly to the third engaging member 53 and the fifth engaging member 55, the first engaging member 51, the second engaging member 52, and the fourth engaging member 54 are also formed in a substantially hook-shape (substantially J-shape), and contact (engage) with the circumferential surface of the substrate 10 and the periphery part of the principal surface of the substrate 10.

The movable guiding member 60 is formed in a substantially rectangular shape, and its front surface is tapered from a tip-end part to a lower-end part thereof. Moreover, the movable guiding member 60 is movable in the front-and-rear direction by a linear actuator 80 provided to the connecting member 70. Note that the movable guiding member 60 may be formed substantially cylindrically, and its circumferential surface may be formed in an arc shape. Moreover, the movable guiding member 60 may be rotatable about its axial center.

Accordingly, when the linear actuator 80 operates, the movable guiding member 60 can reciprocate between an acting position where the movable guiding member 60 contacts with and pushes the circumferential surface of the substrate 10, and a retreated position where it does not contact with the substrate 10.

In Embodiment 1, the linear actuator 80 is an air cylinder, and includes a rod 81 and a sleeve 82 in which the rod 81 reciprocates. Note that the linear actuator 80 is not limited to the air cylinder, but may be a hydraulic cylinder, or a power transmission mechanism combining a drive motor (electric motor; servomotor), and a rack-and-pinion or a ball screw.

Moreover, the linear actuator 80 includes a rail member 83, a sliding member 84, and a movable member 85. The rail member 83 is fixed to the connecting member 70 and guides a trajectory for expansion and contraction of the rod 81. Moreover, the rod 81 is fixed to the sliding member 84, and the sliding member 84 slides on the rail member 83. The movable member 85 is connected at its base-end part to the sliding member 84, and the movable guiding member 60 is rotatably attached to the tip-end part of the movable member 85. Note that the linear actuator 80 is controlled by the controller 110.

[Operation and Effects of Substrate Transfer Device]

Next, operation and effects of the substrate transfer device 101 according to Embodiment 1 are described with reference to FIGS. 1 to 7. Note that the operation described below is executed by the processor of the controller 110 reading the program stored in the memory.

Figure 4:
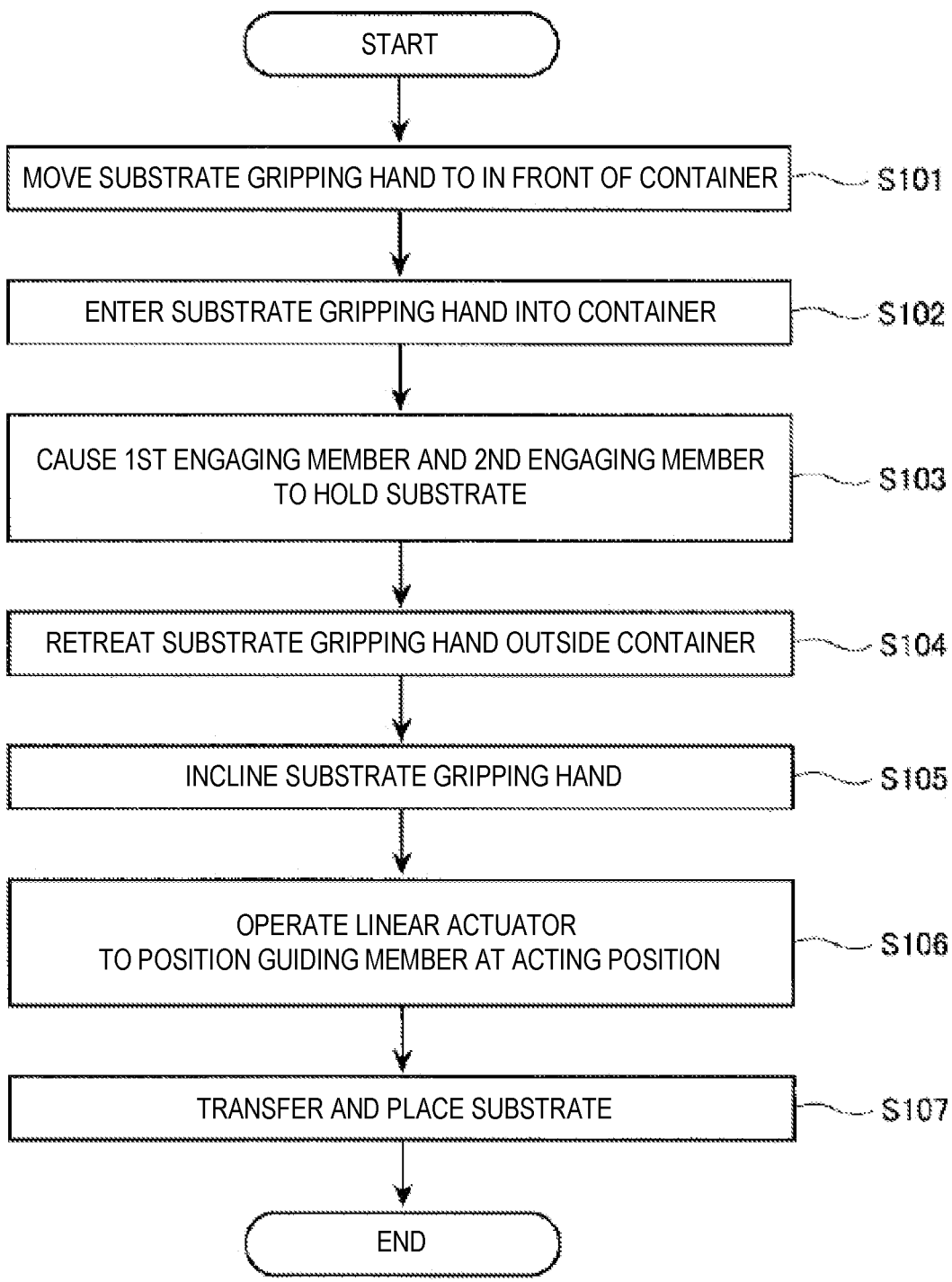
FIG. 4 is a flowchart illustrating one example of operation of the substrate transfer device according to Embodiment 1.
Figure 5:
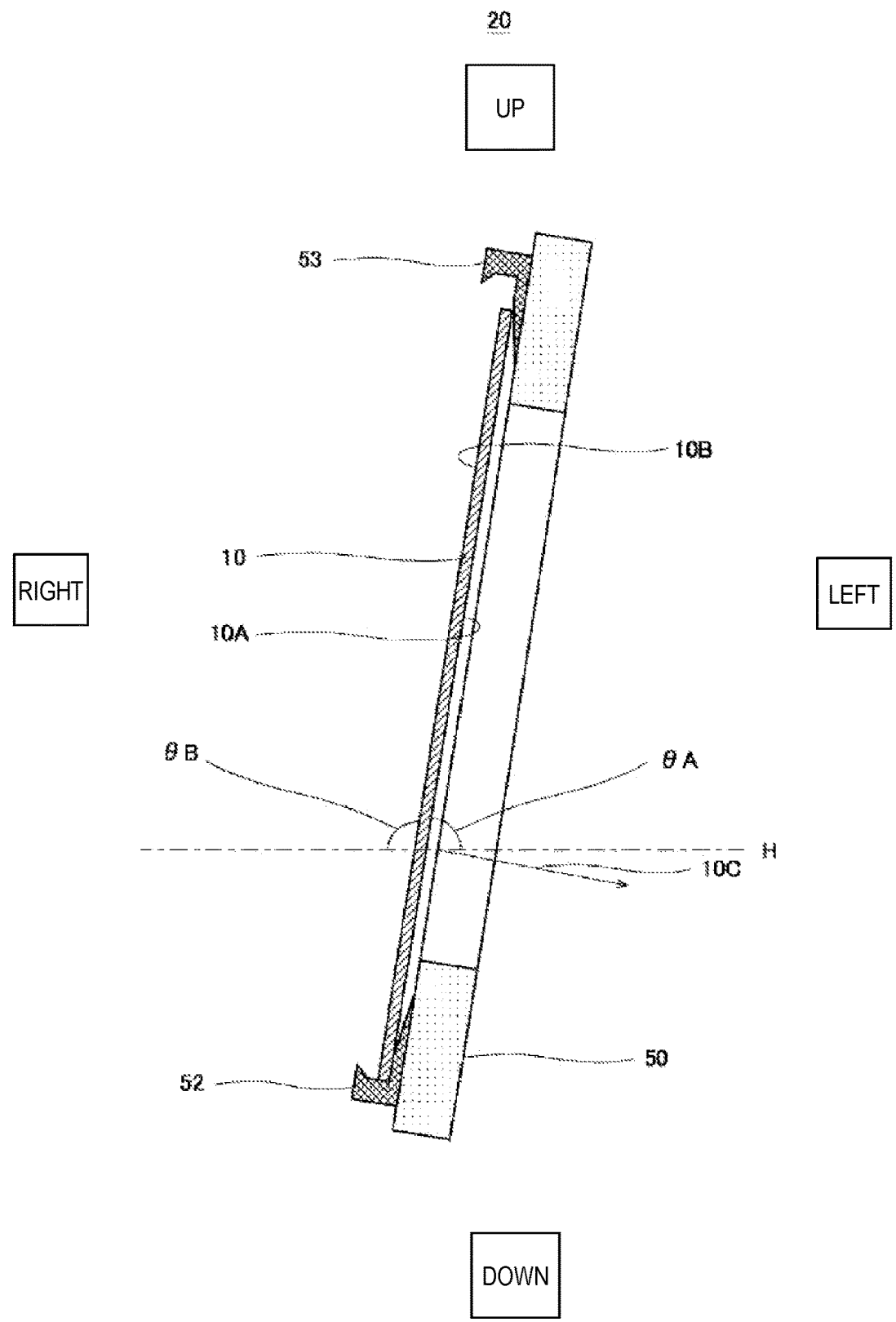
FIG. 5 is a cross sectional view taken along a line V-V illustrated in FIG. 2.
Figure 6:
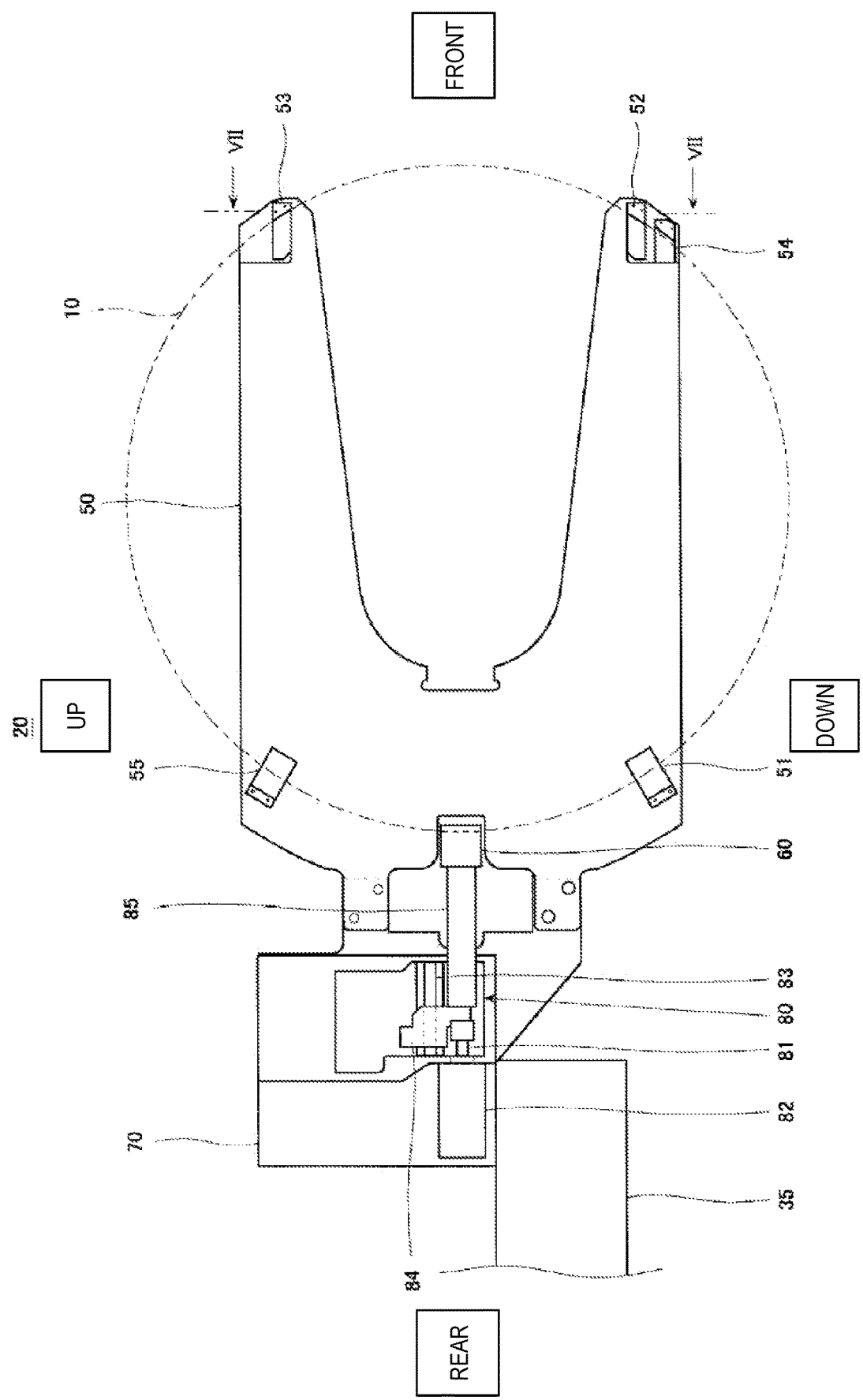
FIG. 6 is a right-side view of the substrate gripping hand of the substrate transfer device illustrated in FIG. 1.
Figure 7:
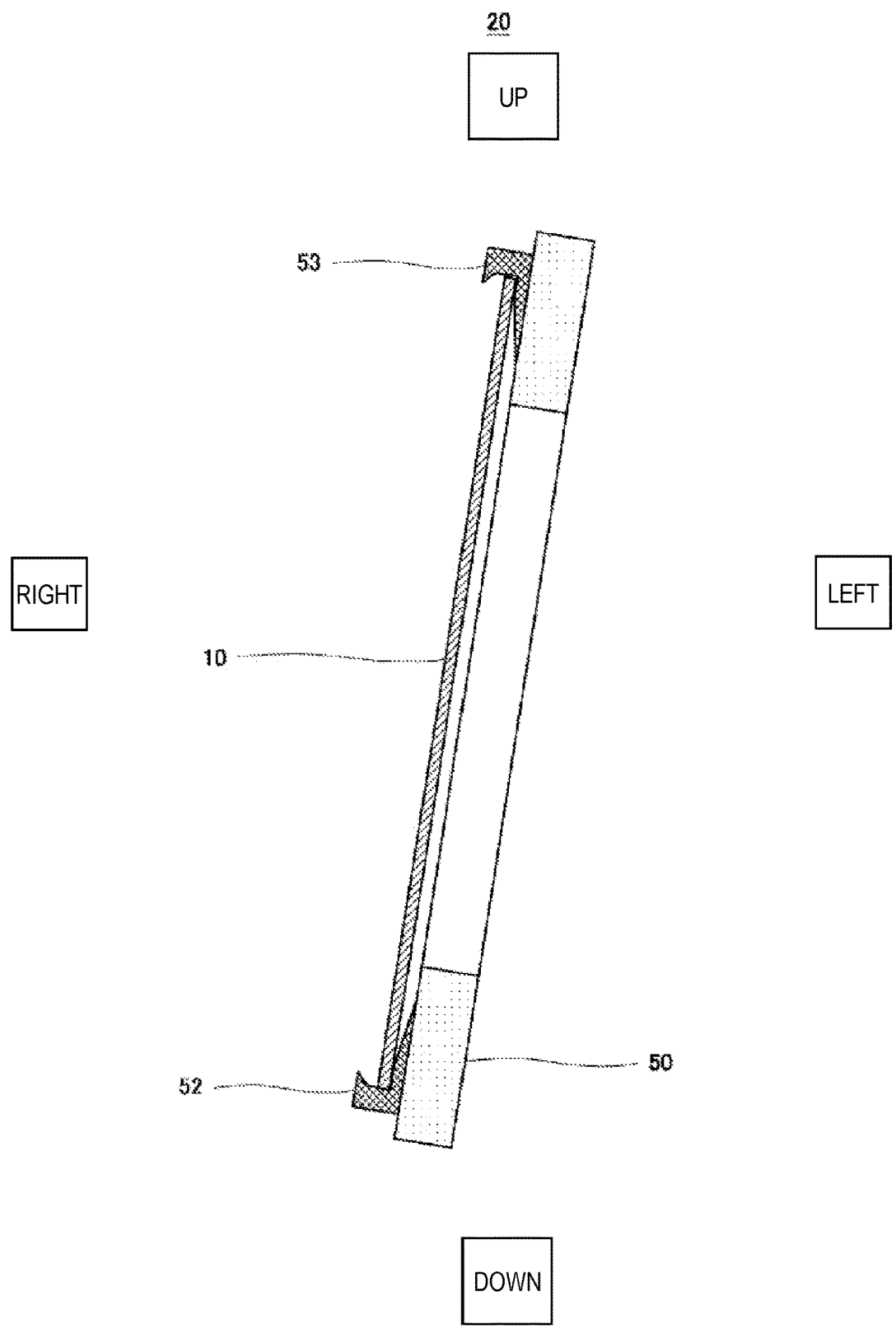
FIG. 7 is a cross sectional view taken along a line VII-VII illustrated in FIG. 6.

FIG. 4 is a flowchart illustrating one example of the operation of the substrate transfer device according to Embodiment 1. FIG. 5 is a cross sectional view taken along a line V-V illustrated in FIG. 2, and illustrates a state in which processing at Step S105 in FIG. 4 is executed. FIG. 6 is a right-side view of the substrate gripping hand of the substrate transfer device illustrated in FIG. 1, and illustrates a state in which processing at Step S106 in FIG. 4 is executed. FIG. 7 is a cross sectional view taken along a line VII-VII illustrated in FIG. 6.

Note that in FIGS. 5 and 7 the up-and-down direction and the left-and-right direction of the substrate transfer device are indicated as the "up-and-down direction" and the "left-and-right direction" of the drawings, respectively.

First, the movable guiding member 60 is located at the retreated position, and assumed to be at the vicinity of the circumferential surface of the substrate 10 when the substrate 10 is held by the first engaging member 51 and the second engaging member 52 (see FIG. 2).

Then, the controller 110 receives input of command information from an operator via an input device (not illustrated) to grip and transfer the substrate 10 placed inside the container 102.

Then, as illustrated in FIG. 4, the controller 110 operates the manipulator 30 to move the substrate gripping hand 20 to a position in front of the container 102 (Step S101). Next, the controller 110 operates the manipulator 30 to enter the substrate gripping hand 20 into the container 102 (Step S102). At this time, the controller 110 enters the substrate gripping hand 20 into the container 102 to a position where the first engaging member 51 and the second engaging member 52 of the substrate gripping hand 20 can place the substrate 10 thereon.

Next, the controller 110 operates the manipulator 30 to move the substrate gripping hand 20 upward, and causes the first engaging member 51 and the second engaging member 52 of the substrate gripping hand 20 to hold the substrate 10 while contacting (engaging) with the substrate 10 (Step S103; see FIG. 2). At this time, the third engaging member 53 and the fourth engaging member 54 do not contact with the circumferential surface of the substrate 10. Note that the fourth engaging member 54 may contact with the circumferential surface of the substrate 10.

Next, the controller 110 operates the manipulator 30 to retreat the substrate gripping hand 20 outside the container 102 (Step S104). Then, the controller 110 operates the manipulator 30 (drive motor 40) to incline the substrate gripping hand 20 (Step S105).

In detail, the controller 110 drives the drive motor 40 so that a first principal surface 10A, which is a principal surface of the substrate 10 facing to the base member 50, is located above the base member 50 and a normal line (normal vector) 10C of the first principal surface 10A is oriented downward from a horizontal plane H (see FIG. 5). In other words, the controller 110 operates the drive motor 40 so that an angle θA between the first principal surface 10A of the substrate 10 and the horizontal plane H becomes an acute angle, and an angle θB between a second principal surface 10B, which is a principal surface of the substrate 10 opposite from the first principal surface 10A, and the horizontal plane H becomes an obtuse angle.

Note that if there is sufficient space inside the container 102, the controller 110 may execute the processing at Step S105 before the processing at Step S104. Alternatively, the controller 110 may simultaneously execute the processing at Step S104 and Step S105.

Next, the controller 110 operates the linear actuator 80 to position the movable guiding member 60 at the acting position (Step S106).

Therefore, the front surface of the movable guiding member 60 contacts and pushes the circumferential surface of the substrate 10. Accordingly, a force acts on the substrate 10 so as to rotate upwardly centering on engaging points with the second engaging member 52 and/or the fourth engaging member 54. Thus, the substrate 10 is pushed upwardly so as to rotate (pivot) centering on the engaging points with the second engaging member 52 and/or the fourth engaging member 54, and contacts (engages) with the third engaging member 53.

As a result, the substrate 10 is gripped by the second engaging member 52 and/or the fourth engaging member 54, the third engaging member 53, and the movable guiding member 60 (see FIGS. 6 and 7).

Note that if there is sufficient space inside the container 102, the controller 110 may execute the processing at Steps S105 and S106 before the processing at Step S104. In this case, the controller 110 may simultaneously execute the processing at Steps S105 and 106. Alternatively, the controller 110 may simultaneously execute the processing at Steps S105 and S106 after the processing at Step S104.

Next, the controller 110 operates the manipulator 30 to transfer and place the substrate 10 at a given position set in advance (Step S107), and ends the program.

According to the substrate transfer device 101 of Embodiment 1 configured as described above, the controller 110 controls the manipulator 30 and the drive motor 40 so as to move the movable guiding member 60 while inclining the substrate gripping hand 20.

Therefore, since a force equivalent to the weight of the substrate 10 acts on the base member 50, the substrate 10 can be prevented from being dropped even if any one of the second engaging member 52, the third engaging member 53, the fourth engaging member 54, and the movable guiding member 60 does not accurately contact with the substrate 10.

Embodiment 2

A substrate transfer device according to Embodiment 2 is the substrate transfer device of Embodiment 1, in which the substrate is maintained in the inclined posture, and in (A), the controller (A1) operates the manipulator to position the substrate gripping hand above the first principal surface, and (A2) then operates the manipulator to hold the substrate by the first engaging member and the second engaging member of the substrate gripping hand.

Below, one example of the substrate transfer device according to Embodiment 2 is described with reference to FIGS. 8 and 9. Note that since a the substrate transfer device and a substrate transfer system including the device according to Embodiment 2 have the same basic configurations as the substrate transfer device and the substrate transfer system including the device according to Embodiment 1, detailed description is omitted.

[Operation and Effects of Substrate Transfer Device]

Figure 8:
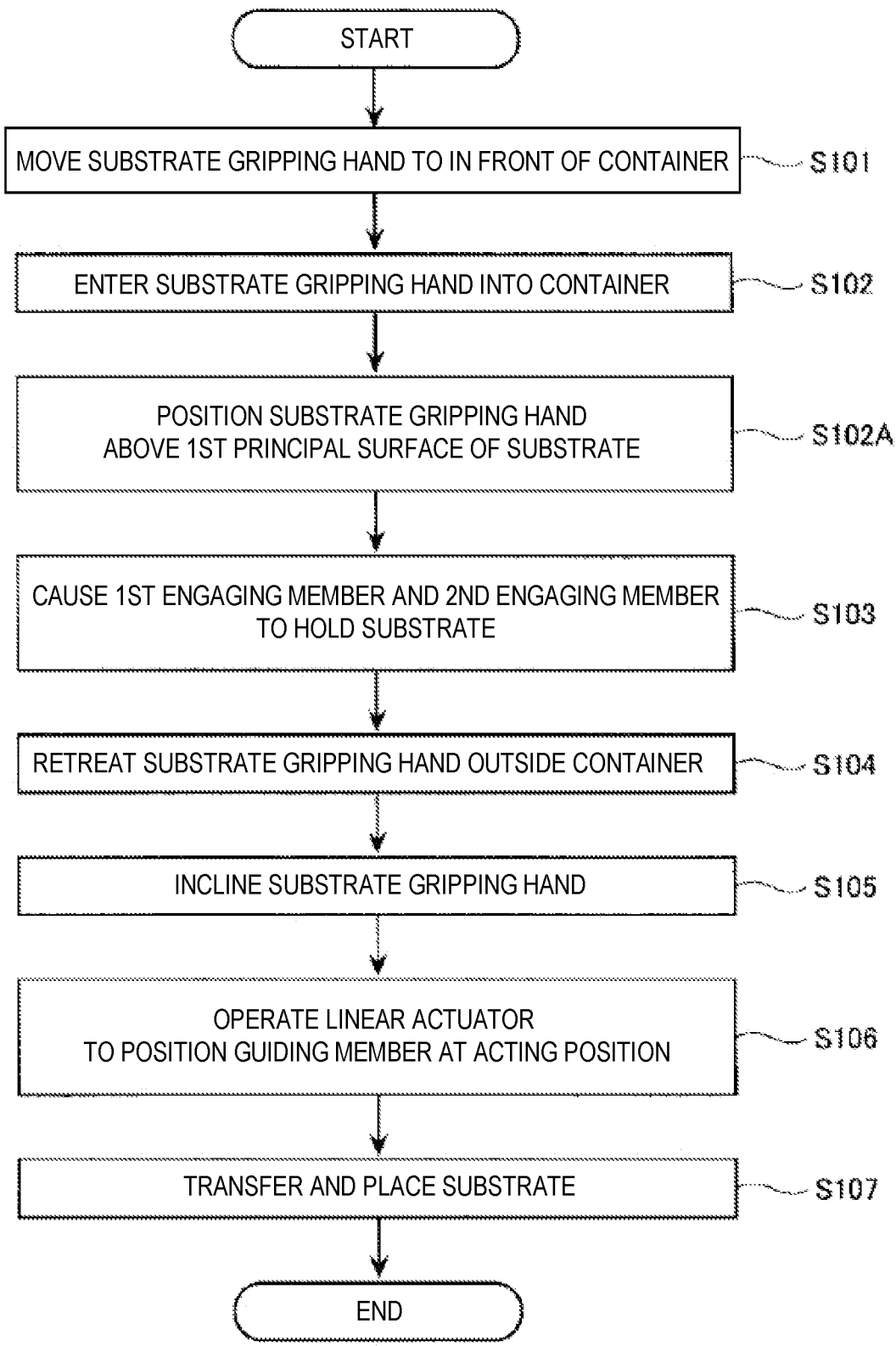
FIG. 8 is a flowchart illustrating one example of operation of a substrate transfer device according to Embodiment 2.
Figure 9:
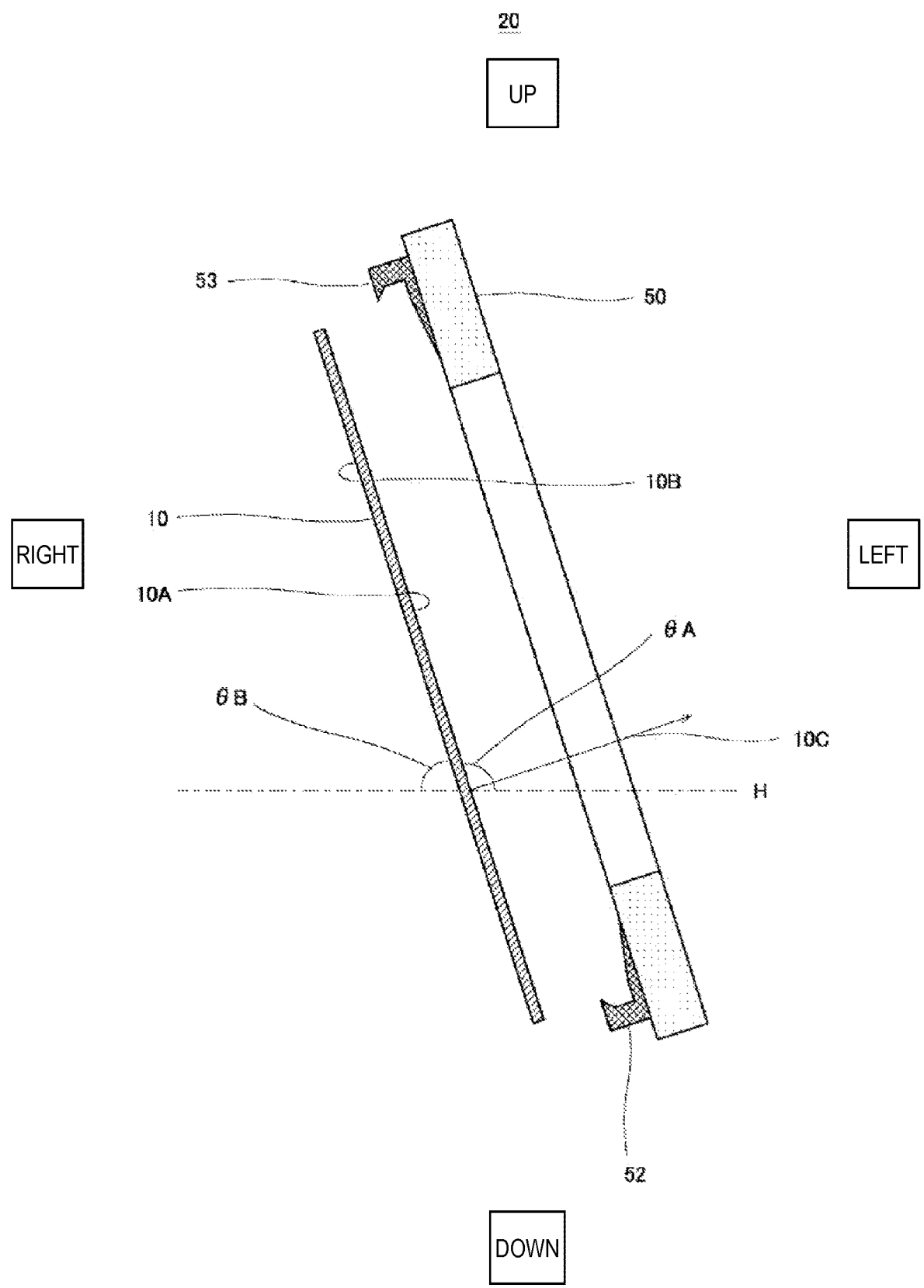
FIG. 9 is a cross sectional view of a substantial part of a substrate gripping hand of the substrate transfer device according to Embodiment 2.

FIG. 8 is a flowchart illustrating one example of operation of the substrate transfer device according to Embodiment 2. FIG. 9 is a cross sectional view of a substantial part of a substrate gripping hand of the substrate transfer device according to Embodiment 2, and illustrates a state in which processing at Step S102A illustrated in FIG. 8 is executed.

As illustrated in FIG. 8, the operation of the substrate transfer device 101 according to Embodiment 2 is basically the same as the operation of the substrate transfer device 101 according to Embodiment 1. However, it is different in that processing at Step S102A is executed between the processing at Step S102 and at Step S103.

In detail, the controller 110 operates the manipulator 30 to enter the substrate gripping hand 20 into the container 102 (Step S102). Next, the controller 110 operates the manipulator 30 to position the substrate gripping hand 20 above the first principal surface 10A of the substrate 10 (Step S102A (see FIG. 9)).

Here, the first principal surface 10A is a principal surface of the inclined substrate 10 of which the angle θA formed with the horizontal plane H becomes an obtuse angle, and the second principal surface 10B is a principal surface of which the angle θB formed with the horizontal plane H becomes an acute angle. In other words, the first principal surface 10A is a surface of which the normal line 10C is oriented upward from the horizontal surface H.

The substrate transfer device 101 according to Embodiment 2 configured as described above also can achieve the operation and effects similar to the substrate transfer device 101 according to Embodiment 1.

Embodiment 3

A substrate transfer device according to Embodiment 3 is a substrate transfer device for gripping and transferring a substrate maintained in one of a vertical posture and an inclined posture. The device includes a manipulator, a substrate gripping hand provided to a tip-end part of the manipulator, an actuator configured to rotate the substrate gripping hand about a roll axis, a first detector configured to detect whether the substrate is correctly gripped by the substrate gripping hand, and a controller. The substrate gripping hand includes a base member in a plate shape, a first engaging member provided at a lower part of a base-end part of the base member, a second engaging member provided at a lower part of a tip-end part of the base member, a third engaging member provided at an upper part of the tip-end part of the base member, and a movable guiding member configured to be movable in a direction of the roll axis. The controller (D) operates the manipulator to hold the substrate by the first engaging member and the second engaging member of the substrate gripping hand. The controller (E) then moves the movable guiding member toward the tip-end part of the base member to push a circumferential surface of the substrate so that the second engaging member, the third engaging member, and the movable guiding member grip the substrate. The controller (F) then moves the movable guiding member toward the base-end part of the base member when the first detector detects that the substrate is not correctly gripped by the substrate gripping hand, and operates the actuator so that a first principal surface of the substrate, that is a principal surface facing to the base member, is located above the base member, and a normal line of the first principal surface is oriented downward from a horizontal plane. The controller then executes (E) again.

In the substrate transfer device according to Embodiment 3, the substrate gripping hand may further include a fourth engaging member provided to the lower part of the tip-end part of the base member, below and on the base-end side of the second engaging member. In (E), the controller may cause the third engaging member, the fourth engaging member, and the movable guiding member to grip the substrate.

Moreover, in the substrate transfer device according to Embodiment 3, in (E), the controller may cause the second engaging member, the third engaging member, the fourth engaging member, and the movable guiding member to grip the substrate.

Below, one example of the substrate transfer device according to Embodiment 3 is described with reference to FIGS. 10 to 14. Note that since the substrate transfer device and a substrate transfer system including the device according to Embodiment 3 have the same basic configurations as the substrate transfer device and the substrate transfer system including the device according to Embodiment 1, detailed description is omitted.

[Configuration of Substrate Transfer Device]

Figure 10:
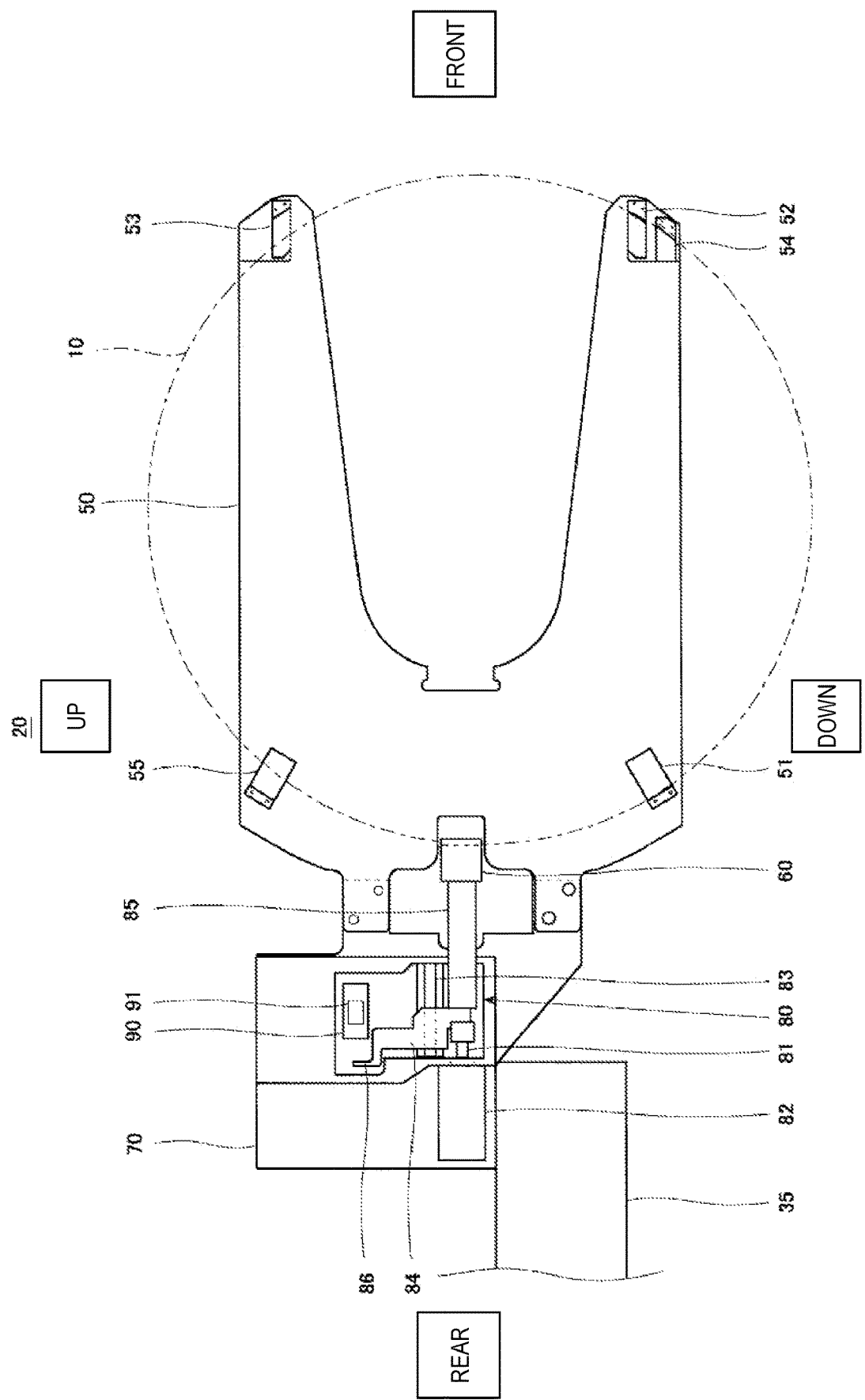
FIG. 10 is a schematic view illustrating an outline configuration of a substrate gripping hand of a substrate transfer device according to Embodiment 3.

FIG. 10 is a schematic view illustrating an outline configuration of a substrate gripping hand of the substrate transfer device according to Embodiment 3. Note that in FIG. 10 the substrate is illustrated by a dashed line so as to facilitate the understanding of the configuration of the substrate gripping hand. In FIG. 10, illustration of a part of the substrate gripping hand is omitted. In FIG. 10, the front-and-rear direction and the up-and-down direction of the substrate transfer device are indicated as the "front-and-rear direction" and the "up-and-down direction" of the drawing, respectively.

As illustrated in FIG. 10, the substrate gripping hand 20 of the substrate transfer device 101 according to Embodiment 3 has the same basic configurations as the substrate gripping hand 20 of the substrate transfer device 101 according to Embodiment 1. However, the substrate gripping hand 20 according to Embodiment 3 is different in that it further includes a first detector 90 which detects whether the substrate 10 is correctly gripped by the substrate gripping hand 20.

The first detector 90 is a positional sensor in Embodiment 3, and detects the position of the movable guiding member 60 to detect whether the substrate 10 is correctly gripped by the substrate gripping hand 20. In detail, a detecting part 91 of the first detector 90 is fixed to the connecting member 70, and a detected part 86 is provided to the sliding member 84. Then, the detecting part 91 detects the position of the detected part 86 to detect the position of the movable guiding member 60, and outputs the detected positional information of the movable guiding member 60 to the controller 110.

The controller 110 determines whether the substrate 10 is correctly gripped by the substrate gripping hand 20 based on the positional information of the movable guiding member 60 outputted from the first detector 90. Note that the first detector 90 may determine whether the substrate 10 is correctly gripped by the substrate gripping hand 20 based on the positional information of the movable guiding member 60 detected by the first detector 90, and output the determined information to the controller 110.

Note that although in Embodiment 3 the first detector 90 detects the position of the movable guiding member 60, it is not limited to this. For example, the first detector 90 may be a positional sensor which detects a position of the substrate 10. Alternatively, the first detector 90 may be a camera, and may output captured image information to the controller 110.

[Operation and Effects of Substrate Transfer Device]

Figure 11A:
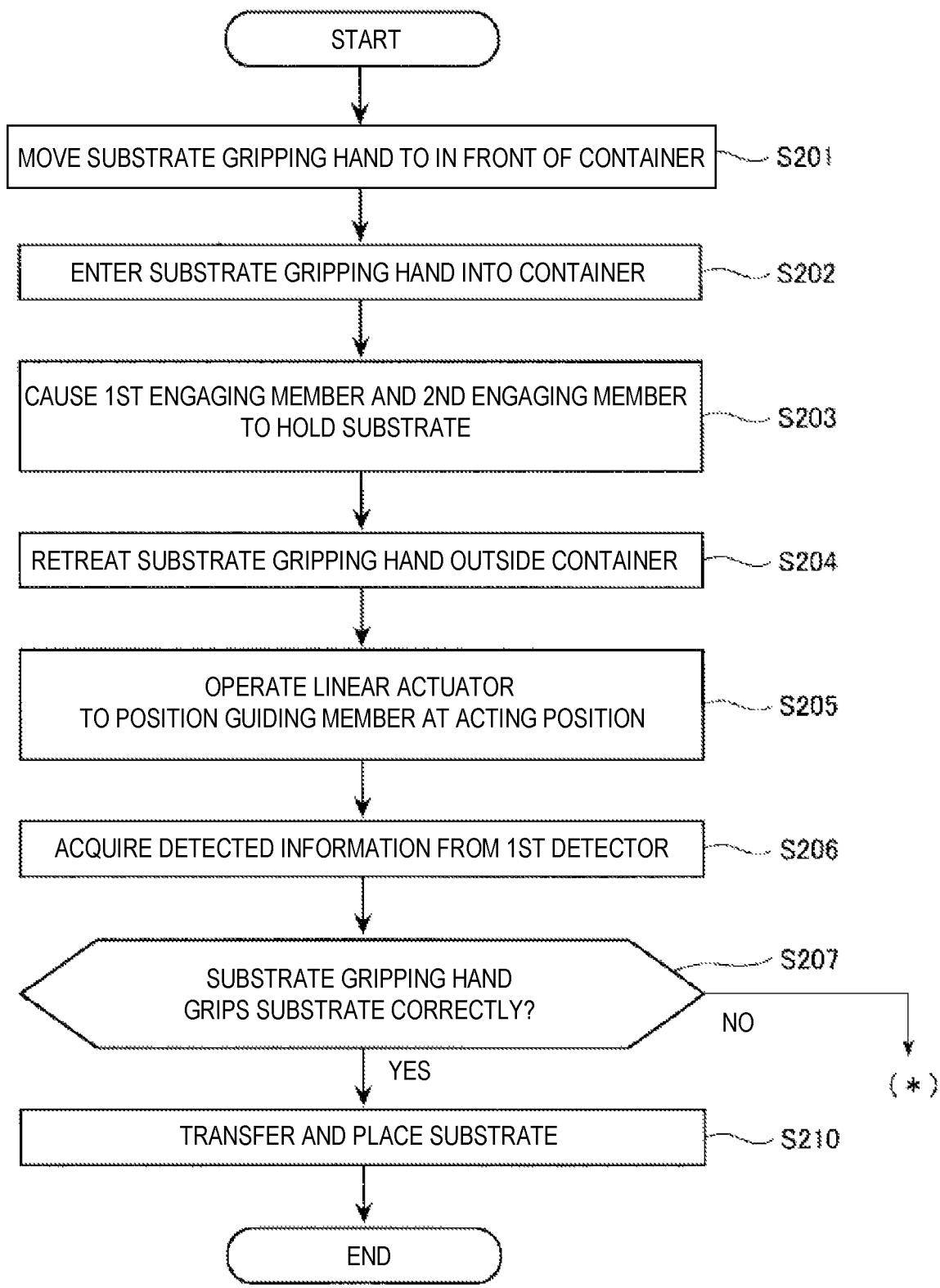
FIG. 11A is a flowchart illustrating one example of operation of the substrate transfer device according to Embodiment 3.
Figure 11B:
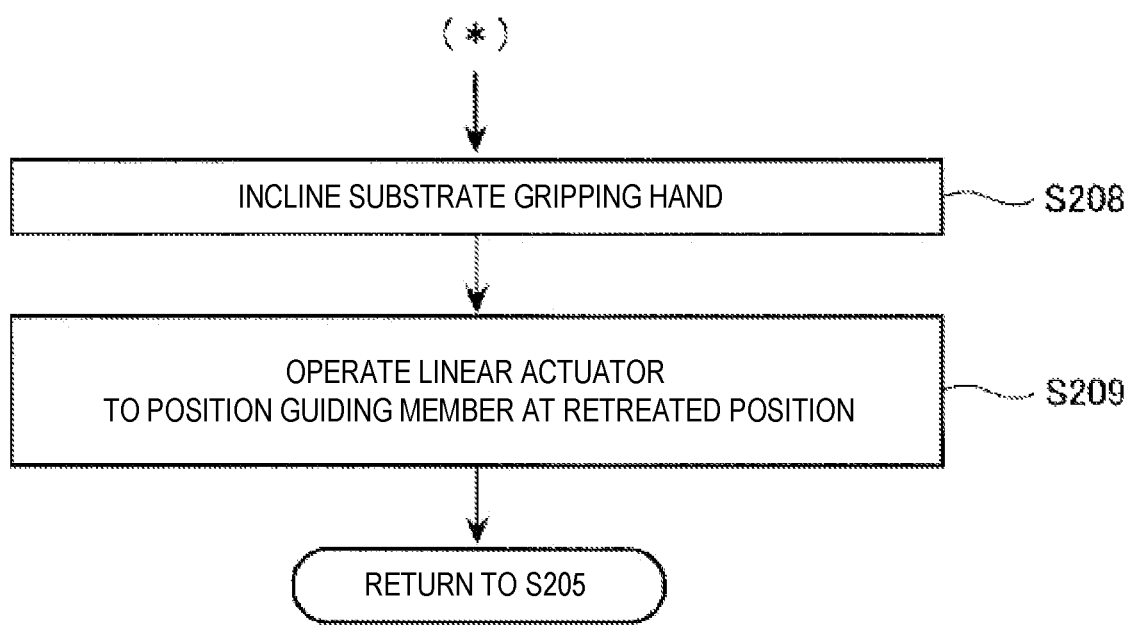
FIG. 11B is a flowchart illustrating one example of operation of the substrate transfer device according to Embodiment 3.
Figure 13:
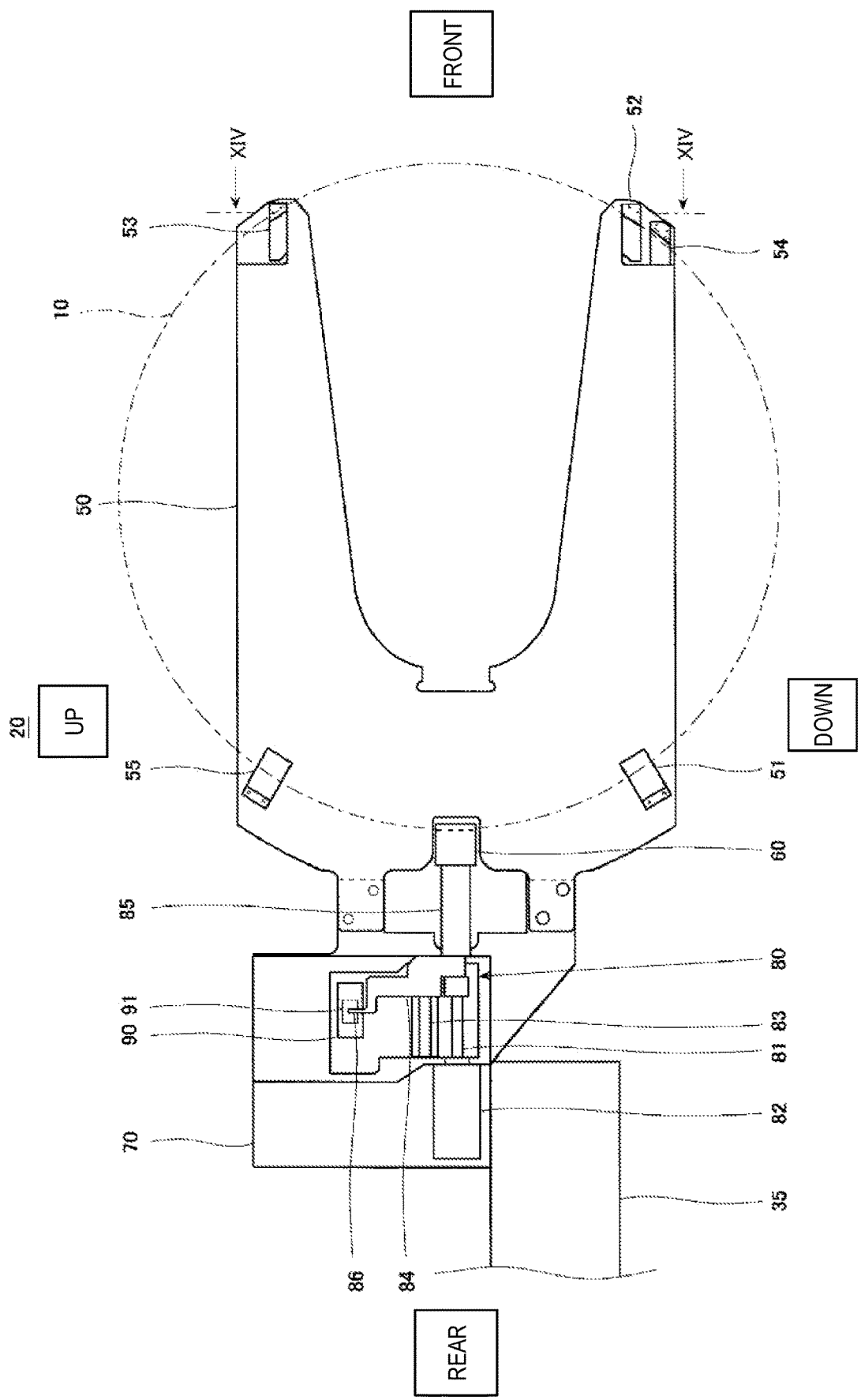
FIG. 13 is a schematic view illustrating an outline configuration of the substrate gripping hand of the substrate transfer device according to Embodiment 3.
Figure 14:
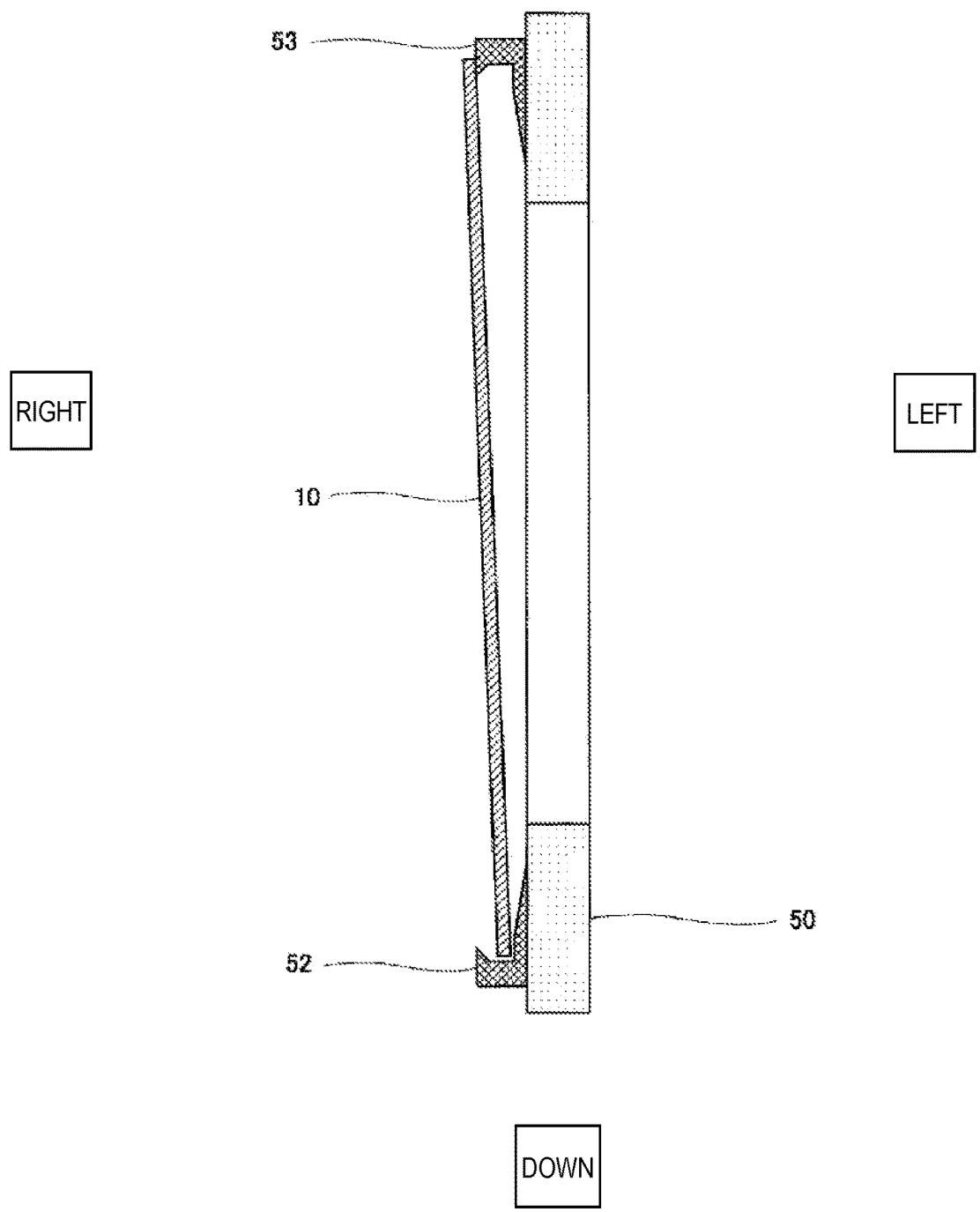
FIG. 14 is a cross sectional view taken along a line XIV-XIV illustrated in FIG. 13.

FIGS. 11A and 11B are flowcharts illustrating one example of operation of the substrate transfer device according to Embodiment 3. FIG. 12 is a schematic view illustrating an outline configuration of the substrate gripping hand of the substrate transfer device according to Embodiment 3, and illustrates a state in which the substrate is correctly gripped. FIG. 13 is a schematic view illustrating an outline configuration of the substrate gripping hand of the substrate transfer device according to Embodiment 3, and illustrates a state in which the substrate is not correctly gripped. FIG. 14 is a cross sectional view taken along a line XIV-XIV illustrated in FIG. 13.

Note that in FIGS. 12 and 13 the substrate is illustrated by a dashed line so as to facilitate the understanding of the configuration of the substrate gripping hand. In FIGS. 12 and 13, illustration of a part of the substrate gripping hand is omitted. In FIGS. 12 and 13, the front-and-rear direction and the up-and-down direction of the substrate transfer device are indicated as the "front-and-rear direction" and the "up-and-down direction" of the drawings, respectively. In FIG. 14, the up-and-down direction and the left-and-right direction of the substrate transfer device are indicated as the "up-and-down direction" and the "left-and-right direction" of the drawing, respectively.

First, similarly to the substrate transfer device 101 according to Embodiment 1, the movable guiding member 60 is located at the retreated position, and assumed to be at the vicinity of the circumferential surface of the substrate 10 when the substrate 10 is held by the first engaging member 51 and the second engaging member 52 (see FIG. 10).

Then, the controller 110 receives input of the command information from the operator via the input device (not illustrated) to grip and transfer the substrate 10 placed inside the container 102.

Then, as illustrated in FIG. 11A, the controller 110 operates the manipulator 30 to move the substrate gripping hand 20 to a position in front of the container 102 (Step S201). Next, the controller 110 operates the manipulator 30 to enter the substrate gripping hand 20 into the container 102 (Step S202). At this time, the controller 110 enters the substrate gripping hand 20 into the container 102 to the position where the first engaging member 51 and the second engaging member 52 of the substrate gripping hand 20 can place the substrate 10 thereon.

Next, the controller 110 operates the manipulator 30 to move the substrate gripping hand 20 upward, and causes the first engaging member 51 and the second engaging member 52 of the substrate gripping hand 20 to hold the substrate 10 while contacting (engaging) with the substrate 10 (Step S203; see FIG. 10). At this time, the third engaging member 53 and the fourth engaging member 54 do not contact with the circumferential surface of the substrate 10. Note that the fourth engaging member 54 may contact with the circumferential surface of the substrate 10.

Next, the controller 110 operates the manipulator 30 to retreat the substrate gripping hand 20 outside the container 102 (Step S204). Then, the controller 110 operates the linear actuator 80 to position the movable guiding member 60 at the acting position (Step S205). Note that if there is sufficient space inside the container 102, the controller 110 may execute the processing at Step S205 before the processing at Step S204.

Therefore, the front surface of the movable guiding member 60 contacts and pushes the circumferential surface of the substrate 10. Accordingly, a force acts on the substrate 10 so as to rotate upwardly centering on the engaging points with the second engaging member 52 and/or the fourth engaging member 54.

Thus, the substrate 10 is pushed upwardly so as to rotate (pivot) centering on the engaging points with the second engaging member 52 and/or the fourth engaging member 54, and contacts (engages) with the third engaging member 53. As a result, the substrate 10 is gripped by the second engaging member 52 and/or the fourth engaging member 54, the third engaging member 53, and the movable guiding member 60 (see FIG. 12).

Meanwhile, if the substrate 10 is not correctly disposed inside the container 102, or the substrate 10 is not correctly held by the first engaging member 51 and the second engaging member 52, the front surface of the movable guiding member 60 may not correctly contact with the circumferential surface of the substrate 10.

In such a case, the linear actuator 80 may move the movable guiding member 60 forward of the acting position, and thus, the substrate 10 may ride onto the third engaging member 53 (see FIGS. 13 and 14). Therefore, in Embodiment 4, the controller 110 is configured to determine whether the substrate 10 is placed correctly.

In detail, the controller 110 acquires the positional information of the detected part 86 (positional information of the movable guiding member 60) detected by the detecting part 91 of the first detector 90. Then, the controller 110 determines whether the substrate gripping hand 20 correctly grips the substrate 10 based on the positional information of the movable guiding member 60 acquired at Step S206 (Step S207).

When the controller 110 determines that the substrate gripping hand 20 does not correctly grip the substrate 10 (NO at Step S207), it operates the manipulator 30 (drive motor 40) to incline the substrate holding hand 20 (Step S208 (see FIG. 11B)). In detail, similarly to the substrate transfer device 101 according to Embodiment 1, the controller 110 drives the drive motor 40 so that the first principal surface 10A of the substrate 10 is located above the base member 50 and the normal line of the first principal surface 10A is oriented downward from the horizontal plane H.

Therefore, since a force equivalent to the weight of the substrate 10 acts on the base member 50, the substrate 10 riding on the third engaging member 53 can be prevented from being dropped from the substrate gripping hand 20.

Next, the controller 110 operates the linear actuator 80 to position the movable guiding member 60 at the retreated position (Step S209). Accordingly, since the substrate 10 is released from the push-up by the movable guiding member 60, it moves rearward accompanying with the retreat of the movable guiding member 60, and thus, the substrate 10 is held by the first engaging member 51 and the second engaging member 52 of the substrate gripping hand 20. Moreover, since the force equivalent to the weight of the substrate 10 acts on the base member 50, the substrate 10 can be prevented from being dropped from the substrate gripping hand 20 even when the substrate 10 is moved rearward.

Note that although in Embodiment 3 the controller 110 executes the processing at Step S209 after the processing at Step S208, it is not limited to this. The controller 110 may simultaneously execute the processing at Step S208 and at Step S209, or may execute the processing at Step S208 after the processing at Step S209.

Next, the controller 110 returns to Step S205, and operates the linear actuator 80 to position the movable guiding member 60 at the acting position. Then, the controller 110 again acquires the positional information of the detected part 86 (positional information of the movable guiding member 60) detected by the detecting part 91 of the first detector 90 (Step S206), and repeats the processing at Steps S205 to S209 until the controller 110 determines that the substrate gripping hand 20 correctly grips the substrate 10.

On the other hand, when the controller 110 determines that the substrate gripping hand 20 correctly grips the substrate 10 (YES at Step S207), it operates the manipulator 30 to transfer and place the substrate 10 at a given position set in advance (Step S210), and ends the program.

In the substrate transfer device 101 according to Embodiment 3 configured as described above, the controller 110 operates the linear actuator 80 to incline the substrate gripping hand 20 when the substrate gripping hand 20 cannot correctly grip the substrate 10.

Therefore, since the force equivalent to the weight of the substrate 10 acts on the base member 50, the substrate 10 riding on the third engaging member 53 can be prevented from being dropped from the substrate gripping hand 20.

Moreover, in the substrate transfer device 101 according to Embodiment 3, the controller 110 operates the linear actuator 80 to retreat the movable guiding member 60 to the retreated position when the substrate 10 cannot be gripped correctly.

Accordingly, since the substrate 10 is released from the push-up by the movable guiding member 60, it moves rearward accompanying with the retreat of the movable guiding member 60, and thus, the substrate 10 can be held by the first engaging member 51 and the second engaging member 52 of the substrate gripping hand 20.

Moreover, in the substrate transfer device 101 according to Embodiment 3, when the substrate gripping hand 20 cannot correctly grip the substrate 10, the controller 110 releases the movable guiding member 60 from the contact with the substrate 10, and again executes the gripping operation of the substrate (the processing at Step S205). Therefore, the substrate transfer device 101 according to Embodiment 3 can grip the substrate 10 more accurately than the conventional substrate transfer device.

Note that although the substrate transfer device 101 according to Embodiment 3 moves the substrate 10 rearward by retreating the movable guiding member 60 to the retreated position, it is not limited to this. For example, the substrate gripping hand 20 may be configured to rotate about a pitch axis, and the substrate 10 may be moved rearward by the movable guiding member 60 being retreated and the substrate gripping hand 20 being rotated (pivoted) about the pitch axis.

Embodiment 4

A substrate transfer device according to Embodiment 4 is the substrate transfer device of Embodiment 3, in which the substrate is maintained in the inclined posture, and in (D), the controller (D1) operates the manipulator to position the substrate gripping hand above the first principal surface, and (D2) then operates the manipulator to hold the substrate by the first engaging member and the second engaging member of the substrate gripping hand.

Below, one example of the substrate transfer device according to Embodiment 4 is described with reference to FIGS. 15A and 15B. Note that since the substrate transfer device and a substrate transfer system including the device according to Embodiment 4 have the same basic configurations as the substrate transfer device and the substrate transfer system including the device according to Embodiment 1, detailed description is omitted.

[Operation and Effects of Substrate Transfer Device]

Figure 15A:
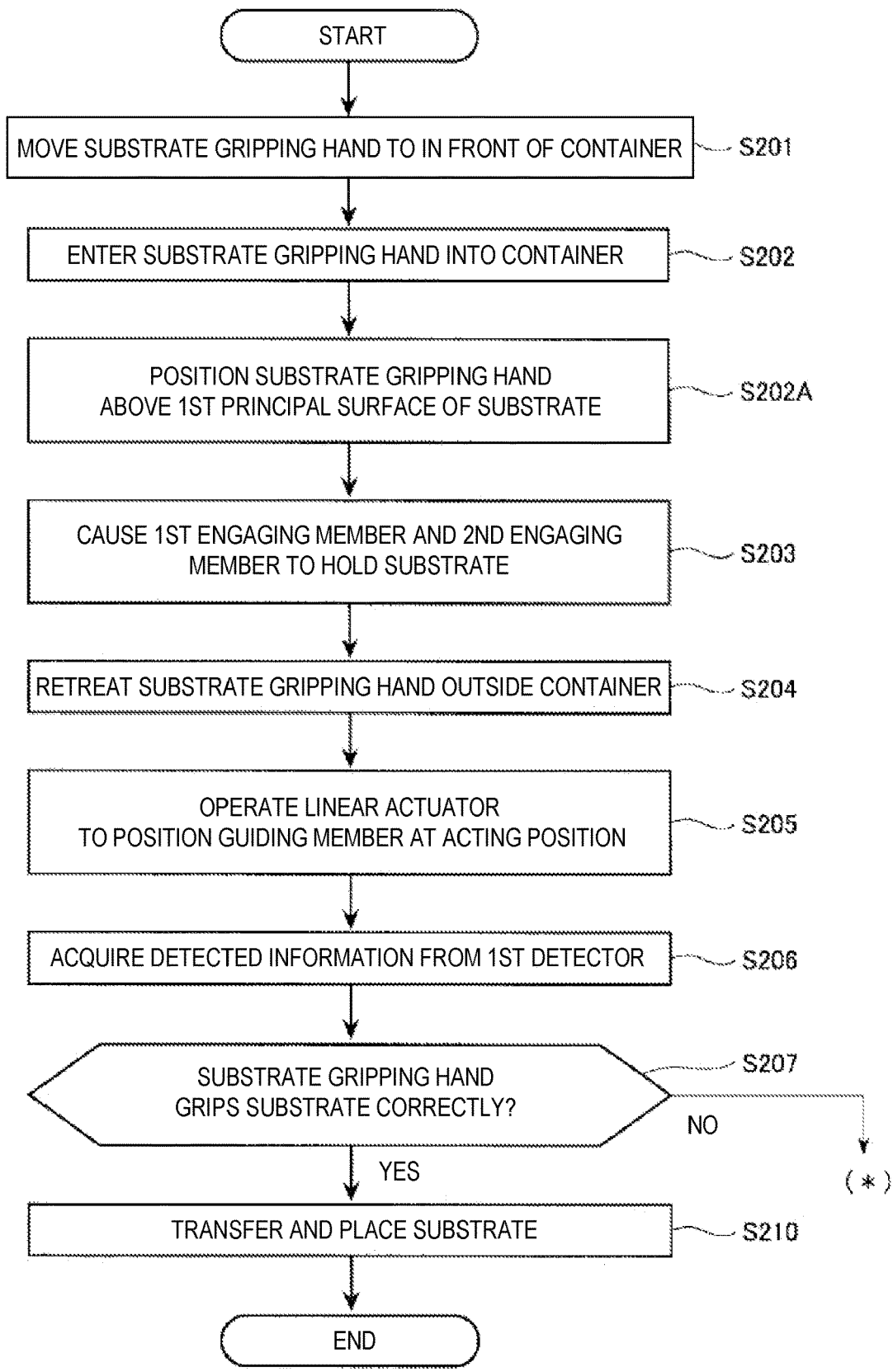
FIG. 15A is a flowchart illustrating one example of operation of a substrate transfer device according to Embodiment 4.
Figure 15B:
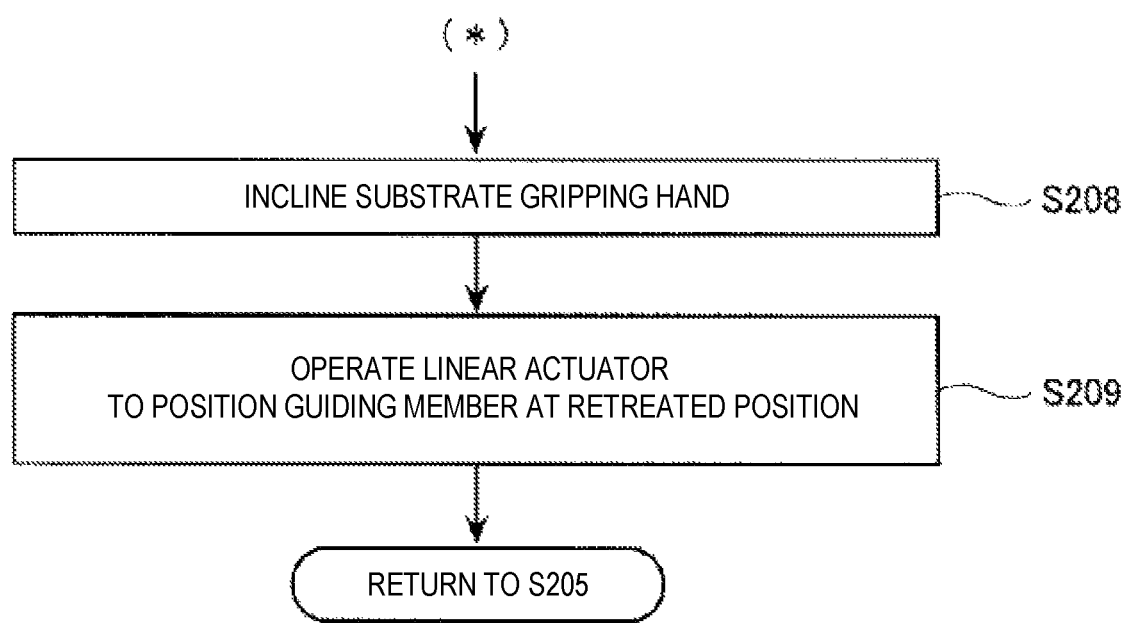
FIG. 15B is a flowchart illustrating one example of operation of the substrate transfer device according to Embodiment 4.

FIGS. 15A and 15B are flowcharts illustrating one example of operation of the substrate transfer device according to Embodiment 4.

As illustrated in FIGS. 15A and 15B, the operation of the substrate transfer device 101 according to Embodiment 4 is basically the same as the operation of the substrate transfer device 101 according to Embodiment 3. However, it is different in that processing at Step S202A is executed between the processing at Step S202 and at Step S203.

In detail, the controller 110 operates the manipulator 30 to enter the substrate gripping hand 20 into the container 102 (Step S202). Then, the controller 110 operates the manipulator 30 to position the substrate gripping hand 20 above the first principal surface 10A of the substrate 10 (Step S202A (see FIG. 9)).

Here, the first principal surface 10A is a principal surface of the inclined substrate 10 of which the angle θA formed with the horizontal plane H becomes an obtuse angle, and the second principal surface 10B is a principal surface of which the angle θB formed with the horizontal plane H becomes an acute angle. In other words, the first principal surface 10A is a surface of which the normal line 10C is oriented upward from the horizontal surface H.

The substrate transfer device 101 according to Embodiment 4 configured as described above also can achieve the operation and effects similar to the substrate transfer device 101 according to Embodiment 3.

It is apparent for a person skilled in the art from the above description that many improvements and other embodiments of the present disclosure are possible. Therefore, the above description is to be interpreted only as illustration, and it is provided in order to teach a person skilled in the art the best mode to implement the present disclosure. The details of the structures and/or the functions may be substantially changed, without departing from the spirit of the present disclosure.

INDUSTRIAL APPLICABILITY

The substrate transfer device and the method of operating the substrate transfer device according to the present disclosure are useful in a field of industrial robots because dropping of substrates can be reduced compared to the conventional substrate transfer device.

DESCRIPTION OF REFERENCE CHARACTERS

10 Substrate
10A First Principal Surface
10B Second Principal Surface
20 Substrate Gripping Hand
30 Manipulator
31 Pedestal
32 First Arm
33 Second Arm
34 Third Arm
35 Base Part
36 Support Shaft
37 First Connecting Part
38 Second Connecting Part
39 Third Connecting Part
40 Drive Motor
50 Base Member
51 First Engaging Member
52 Second Engaging Member
53 Third Engaging Member
54 Fourth Engaging Member
55 Fifth Engaging Member
60 Movable Guiding Member
70 Connecting Member
80 Linear Actuator
81 Rod
82 Sleeve
83 Rail Member
84 Sliding Member
85 Movable Member
86 Detected Part
90 First Detector
91 Detecting Part
100 Substrate Transfer System
101 Substrate Transfer Device
102 Container
110 Controller
H Horizontal Plane
L1 Rotation Axis
L2 Rotation Axis
L3 Rotation Axis
L4 Rotation Axis
θA Angle
θB Angle

What is claimed is:

1. A substrate transfer device for gripping and transferring a substrate maintained in one of a vertical posture and an inclined posture, the device comprising:
a manipulator;
a substrate gripping hand at a tip-end part of the manipulator;
an actuator configured to rotate the substrate gripping hand about a roll axis; and
a controller comprising a processor and a memory that stores a program,
wherein the substrate gripping hand includes:
a base member in a plate shape;
a first engaging member at a lower part of a base-end part of the base member;
a second engaging member at a lower part of a tip-end part of the base member;
a third engaging member at an upper part of the tip-end part of the base member; and
a movable guiding member configured to be movable in a direction of the roll axis, and
wherein the processor executes the program so that the controller is configured to:
(A) with the substrate gripping hand being in a first orientation, operate the manipulator to move the substrate gripping hand upward so as to hold the substrate by the first engaging member and the second engaging member of the substrate gripping hand;
(B) after (A), operate the actuator to rotate the substrate gripping hand from the first orientation to a second, inclined orientation at which (i) a first principal surface of the substrate, which is a principal surface facing toward the base member, is located above the base member and (ii) a normal line of the first principal surface is oriented downward from a horizontal plane; and
(C) after (B), move the movable guiding member toward the tip-end part of the base member to push a circumferential surface of the substrate so that the second engaging member, the third engaging member, and the movable guiding member grip the substrate.

2. The substrate transfer device of claim 1, wherein the substrate gripping hand further includes a fourth engaging member at the lower part of the tip-end part of the base member, below and on a base-end side of the second engaging member.

3. The substrate transfer device of claim 1,
wherein the substrate is maintained in the inclined posture, and
wherein, in (A), the controller is configured to:
(A1) operate the manipulator to position the substrate gripping hand above the first principal surface; and
(A2) then operate the manipulator to hold the substrate by the first engaging member and the second engaging member of the substrate gripping hand.

4. A method of operating a substrate transfer device for gripping and transferring a substrate maintained in one of a vertical posture and an inclined posture,
the device including:
a manipulator;
a substrate gripping hand at a tip-end part of the manipulator; and
an actuator configured to rotate the substrate gripping hand about a roll axis,
wherein the substrate gripping hand includes:
a base member in a plate shape;
a first engaging member at a lower part of a base-end part of the base member;

a second engaging member at a lower part of a tip-end part of the base member;
a third engaging member at an upper part of the tip-end part of the base member; and
a movable guiding member configured to be movable in a direction of the roll axis, the method comprising:
(A) with the substrate gripping hand being in a first orientation, operating the manipulator to move the substrate gripping hand upward so as to hold the substrate by the first engaging member and the second engaging member of the substrate gripping hand;
(B) after (A), operating the actuator to rotate the substrate gripping hand from the first orientation to a second, inclined orientation at which (i) a first principal surface of the substrate, which is a principal surface facing toward the base member, is located above the base member and (ii) a normal line of the first principal surface is oriented downward from a horizontal plane; and
(C) after (B), moving the movable guiding member to push a circumferential surface of the substrate so that the second engaging member, the third engaging member, and the movable guiding member grip the substrate.

5. The method of claim 4, wherein
in (A), the substrate is held by only the first engaging member and the second engaging member of the substrate gripping hand, and
in (C), the substrate is held by only the second engaging member, the third engaging member, and the movable guiding member of the substrate gripping hand.

6. A substrate transfer device for gripping and transferring a substrate, the substrate being gripped in one of a vertical posture and an inclined posture, the device comprising:
a manipulator;
a substrate gripping hand at a tip-end part of the manipulator;
an actuator configured to rotate the substrate gripping hand about a roll axis; and
a controller comprising a processor and a memory that stores a program,
wherein the substrate gripping hand includes:
a base member in a plate shape;
a first engaging member at a lower part of a base-end part of the base member;
a second engaging member at a lower part of a tip-end part of the base member;
a third engaging member at an upper part of the tip-end part of the base member; and
a movable guiding member configured to be movable in a direction of the roll axis, and
wherein the processor executes the program so that the controller is configured to:
(A) with the substrate gripping hand being in a first orientation, operate the manipulator to move the substrate gripping hand upward so as to hold the substrate by the first engaging member and the second engaging member of the substrate gripping hand, and
(B) after (A), move the movable guiding member toward the tip-end part of the base member to push a circumferential surface of the substrate so that the second engaging member, the third engaging member, and the movable guiding member grip the substrate.

* * * * *